US006873174B2

(12) United States Patent
Matsunaga et al.

(10) Patent No.: US 6,873,174 B2
(45) Date of Patent: Mar. 29, 2005

(54) ELECTRONIC INSPECTION OF AN ARRAY

(75) Inventors: Ikuo Matsunaga, Fukaya (JP); Ryoichi Watanabe, Yokohama (JP); Masahiro Seiki, Fukaya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 312 days.

(21) Appl. No.: 09/753,607

(22) Filed: Jan. 4, 2001

(65) Prior Publication Data

US 2003/0184334 A1 Oct. 2, 2003

(30) Foreign Application Priority Data

Jan. 6, 2000 (JP) ....................................... 2000-001054
Jan. 12, 2000 (JP) ....................................... 2000-003616

(51) Int. Cl.[7] ................................................ G01R 31/02

(52) U.S. Cl. ..................... 324/770; 324/765; 324/158.1

(58) Field of Search ................................ 324/500–537, 324/765–770; 349/192; 438/14–18

(56) References Cited

U.S. PATENT DOCUMENTS

| | | | | |
|---|---|---|---|---|
| 5,428,300 A | * | 6/1995 | Takahashi et al. | 324/770 |
| 5,608,558 A | * | 3/1997 | Katsumi | 349/192 |
| 5,994,916 A | * | 11/1999 | Hayashi | 324/770 |

FOREIGN PATENT DOCUMENTS

| | | |
|---|---|---|
| JP | 61-87197 | 5/1986 |
| JP | 4-52684 | 2/1992 |
| JP | 11-174486 | 7/1999 |
| JP | 11-296142 | 10/1999 |
| JP | 11-327518 | 11/1999 |

* cited by examiner

*Primary Examiner*—Vinh P. Nguyen
(74) *Attorney, Agent, or Firm*—Pillsbury Winthrop LLP

(57) ABSTRACT

A first signal line and a second signal line are paired, and in one signal line selection period, CPU of the inspection circuit controls a write circuit and writes analog signals into the first signal line selected by means of a switch of the selection circuit. In the next signal line selection period, CPU controls a read circuit and reads output signals from the second signal line selected by means of the switch. CPU detects a short circuit between the paired signal lines based upon the output signals from the second signal line.

6 Claims, 14 Drawing Sheets

ELECTRONIC INSPECTION OF AN ARRAY

CROSS-REFERENCE TO RELATED APPLICATIONS

This application is based upon and claims the benefit of priority from the prior Japanese Patent Applications No. 2000-001054, filed Jan. 6, 2000; and No. 2000-003616, filed Jan. 12, 2000, the entire contents of which are incorporated herein by reference.

BACKGROUND OF THE INVENTION

The present invention relates to a method of inspecting an array substrate, and particularly to a method of inspecting an array substrate being capable of reducing connections of an outer circuit in number.

In a display device, for example, in a liquid crystal display device using a polycrystalline silicon TFT, a portion of the signal line drive circuit and the gate line drive circuit are formed integrally on an array substrate. In this case, a portion of the signal line drive circuit, for example, the D/A converter circuit is mounted outside the substrate. The liquid crystal display device formed like this is capable of reducing connection wires between the array substrate and an outer circuit substantially in comparison to a liquid crystal display device using an amorphous silicon TFT.

An open defect means a line including some breaking points in the line. A short circuit means a line including some connecting points to another line.

In a display device as described above, when inspecting a short circuit between adjacent signal lines, an inspection pad is mounted on each signal line, an inspection circuit probe is connected to this pad, continuity between adjacent signal lines is inspected, and the short circuit between both signal lines is detected in case of continuity being established between them.

Moreover, in a display device as described above, when inspecting breaking of a signal line, inspection pads are mounted at both ends of each signal line, inspection circuit probes are connected to these pads, continuity through the signal lines is inspected, and breaking of wire is detected in case of no continuity is established through the signal line.

However, in order to inspect a short circuit between the signal lines, not only inspection pads as many as the signal lines, but also inspection probes corresponding to the number of pads are required. Moreover, in order to inspect breaking of the signal lines, not only inspection pads two times the number of the signal lines, but also inspection probes corresponding to the number of pads are required.

As described above, since a number of inspections probes are required, the cost of the inspection circuit is increased and there is also a problem of complicated maintenance.

Moreover, when highly fine pixels involve increased signal lines, it becomes difficult to secure space for mounting inspection pads, and the advantage of using a polycrystalline silicon TFT is reduced.

BRIEF SUMMARY OF THE INVENTION

The present invention has been made in consideration of the above-described problems and has an object of providing an array substrate for a display device being capable of realizing highly fine pixels. Moreover, the present inventions has another object of providing a method of inspecting an array substrate for detecting a short circuit and breaking of a wire certainly without an increase in cost by using an easy maintenance inspection circuit.

According to the present invention, in a method of inspecting an array substrate according to claim 1, the method of inspecting an array substrate comprising a plurality of gate and signal lines disposed on the substrate with intersecting perpendicularly each other, a switching element disposed on each intersecting portion of the gate lines and the signal lines, a pixel capacitance electrically connected to each switching element, a plurality of input terminals into which signals outputted from an external drive circuit are inputted, and a selection means distributing signals inputted from each of the input terminals to at least one signal line of a signal line group including a plurality of signal lines sequentially, comprises the steps of:

writing signals into one signal line in a first signal line selection period in which the one signal line is selected from the signal line group including a plurality of signal lines;

reading signals from another signal line in a second signal line selection period following the first signal line selection period in which the another signal line is selected from the signal line group; and inspecting a short circuit between the one signal line and the another signal line based upon the read signals.

In a method of inspecting an array substrate according to claim 4, the method of inspecting an array substrate comprising a plurality of gate and signal lines disposed on the substrate with intersecting perpendicularly each other, a switching element disposed on each intersecting portion of the gate lines and the signal lines, a pixel capacitance connected electrically to each switching element, a plurality of input terminals into which signals outputted from an external drive circuit are inputted, a selection means distributing signals inputted from each of the input terminals to at least one signal line of a signal line group including a plurality of signal lines sequentially, and a distribution means putting continuity between one signal line and another signal line of the signal line group into ON/OFF, the method of inspecting an array substrate comprising the steps of:

establishing continuity between the one signal line and the another signal line;

writing signals into the one signal line in a first signal line selection period in which the one signal line is selected from the signal line group including a plurality of signal lines;

reading signals from the another signal line in a timing following the first signal line selection period in a second signal line selection period in which the another signal line is selected from the signal line group; and inspecting breaking of the one signal line and the another signal line based upon the read signals.

An array substrate according to claim 12 comprises:

a plurality of gate and signal lines disposed on the substrate with intersecting perpendicularly each other;

a switching element disposed on each intersecting portion of the gate lines and the signal lines;

a pixel capacitance connected electrically to each switching element;

a plurality of input terminals into which signals outputted from an external drive circuit are inputted;

a selection means distributing signals inputted from the input terminals to a plurality of adjacent signal lines sequentially; and an inspection pad disposed between the selection means and the switching element and connected electrically to the signal lines.

In a method of inspecting an array substrate according to claim 16, the method of inspecting an array substrate comprising:

a plurality of gate and signal lines disposed on the substrate with intersecting perpendicularly each other;

a switching element disposed on each intersecting portion of the gate lines and the signal lines;

a pixel capacitance connected electrically to the switching elements;

a plurality of input terminals into which signals outputted from an external drive circuit are inputted;

a selection means distributing signals inputted from the input terminals to at least one signal line of a signal line group including a plurality of signal lines sequentially; and an inspection pad disposed between the selection means and the switching element and connected electrically to the signal line, the method of inspecting an array substrate comprising the steps of:

selecting a first signal line by means of the selection means;

writing signals from the input terminals into the first signal line;

reading output signals outputted from the second signal line via the inspection pad; and inspecting a short circuit between the first signal line and the second signal line based upon the signals read from the inspection pad.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
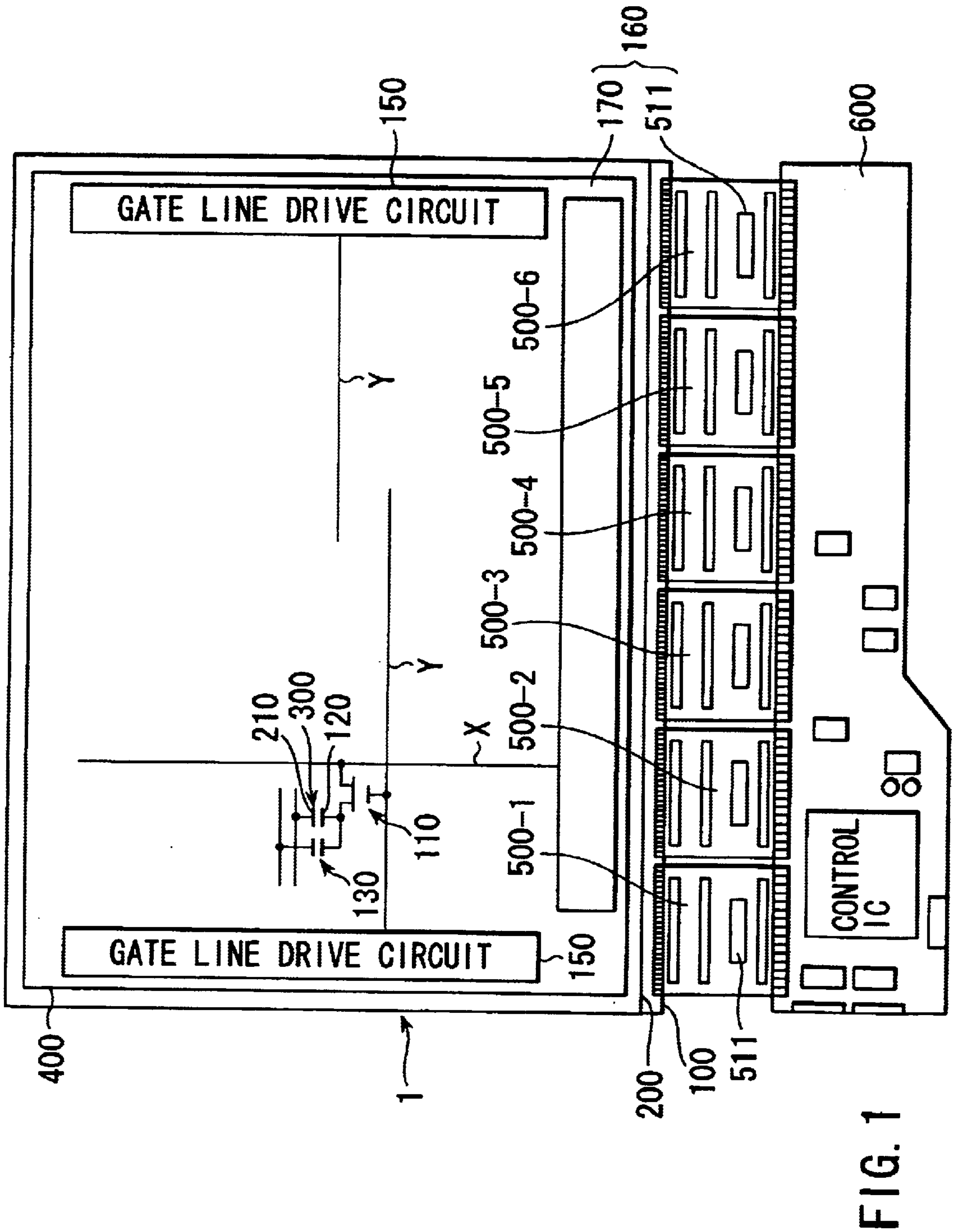
FIG. 1 is a view showing schematically the composition of a liquid crystal display device according to one embodiment of a display device to which an array substrate according to the present invention is applied.

Now, referring to the drawings, one embodiment of the inspection method of the present invention, for example, a method of inspecting a short circuit and breaking of a wire of signal lines applied to a light-transmittance type liquid crystal display device using a polycrystalline silicon TFT as pixel switching element and having the size of diagonal 15 inches as effective display area, will be described.

As shown in FIG. 1, this display device 1 comprises an array substrate 100, an counter substrate 200 disposed opposed to this array substrate 100 in a predetermined distance, and a liquid crystal layer 300 sandwiched between the array substrate 100 and the counter substrate 200 and disposed via an alignment layer. The array substrate 100 and the counter substrate 200 are bonded together by means of a sealing material 400 disposed nearby.

The array substrate 100 comprises a plurality of gate lines Y extended in a row direction, a plurality of signal lines X extended in a column direction, a pixel thin film transistor, that is, a pixel TFT 110, formed as switching element in each intersecting portion of the gate lines Y and the signal lines X, and a pixel electrode 120 disposed corresponding to each pixel surrounded by the gate lines Y and the signal lines X.

The pixel TFT uses a polycrystalline silicon film as semiconductor layer. The gate electrode of the pixel TFT 110 is connected to a gate line Y. The drain electrode of the pixel TFT 110 is connected to a signal line X. The source electrode of the pixel TFT 110 is connected to a pixel electrode 120 and to one electrode composing an storage capacitance element 130 in parallel to this pixel electrode 120.

As shown in FIG. 1, this liquid crystal display device 1 has a liquid crystal capacitance composed of a pixel electrode 120 of the array substrate 100, a liquid crystal layer 300, and a counter electrode of the counter substrate 200. Moreover, the liquid crystal display device 1 has storage capacitances (pixel capacitances) connected in parallel to the liquid capacitance. This storage capacitance is formed of an storage capacitance element 130.

A gate line drive circuit 150 functioning as gate line drive means outputting drive signals for the gate lines Y is formed integrally on the array substrate 100 in the same process as the pixel TFT 100.

A signal line drive circuit portion 160 outputting drive signals for driving the signal lines X is composed of TCPs (tape carrier package) 500-1, 500-2, . . . , 500-6, and a selection circuit 170 functioning as selection means. Each of TCPs 500-1, 500-2, . . . , 500-6 comprises an signal line drive IC 511 mounted on a flexible wiring substrate and is connected electrically to the array substrate 100. The selection circuit 170 is formed on the array substrate 100 in the same process as the pixel TFT 110.

TCPs 500-1 to 6 are mounted on one side of the array substrate 100 in a row and are connected to a PCB (printed-circuit-board) substrate 600 as an external circuit board. On this PCB substrate 600 a control IC outputting various control signals and data signals synchronized therewith based upon a reference clock signal and digital data signals inputted from an external circuit, a power source circuit and the like are mounted.

Figure 2:
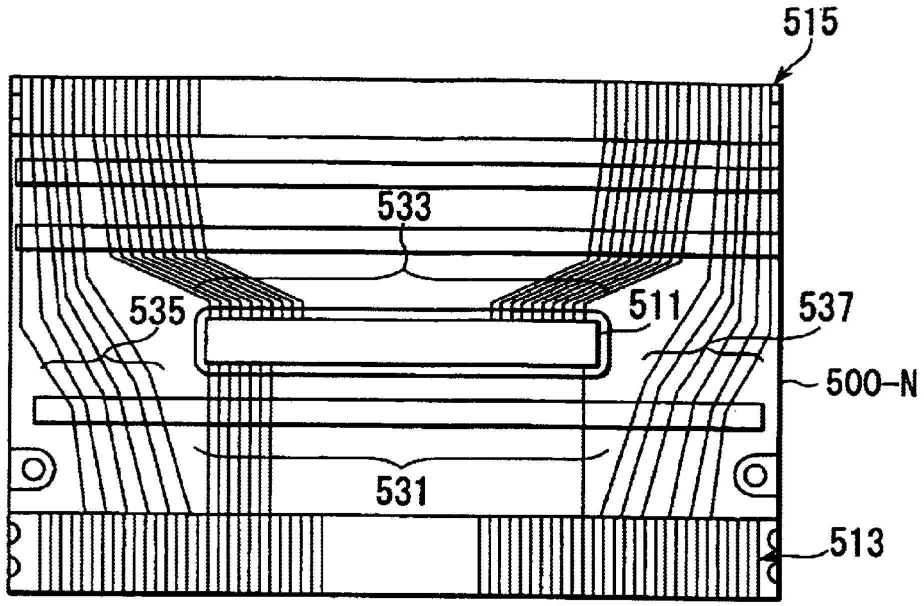
FIG. 2 is a view showing schematically the composition of a TCP mounted on one side of the liquid crystal display device shown in FIG. 1.

TCP 500-N (N=1, 2, 3, 4, 5, 6) comprises, as shown in FIG. 2, PCB side pads 513 connected to connection terminals of the connection wires formed on the PCB substrate 600, array side pads 515 connected to connection terminals of the connection wires formed on the array substrate 100, and various wires connecting these pads with each other. These PCB side pad 513 and array side pad 515 are connected electrically to the PCB substrate 600 and the array substrate 100 via an anisotropic conductive film (ACF).

The signal line drive IC 511 of the signal line drive circuit portion 160 outputs data signals as analog picture signals based upon the input signals from the PCB substrate 600.

Figure 3:
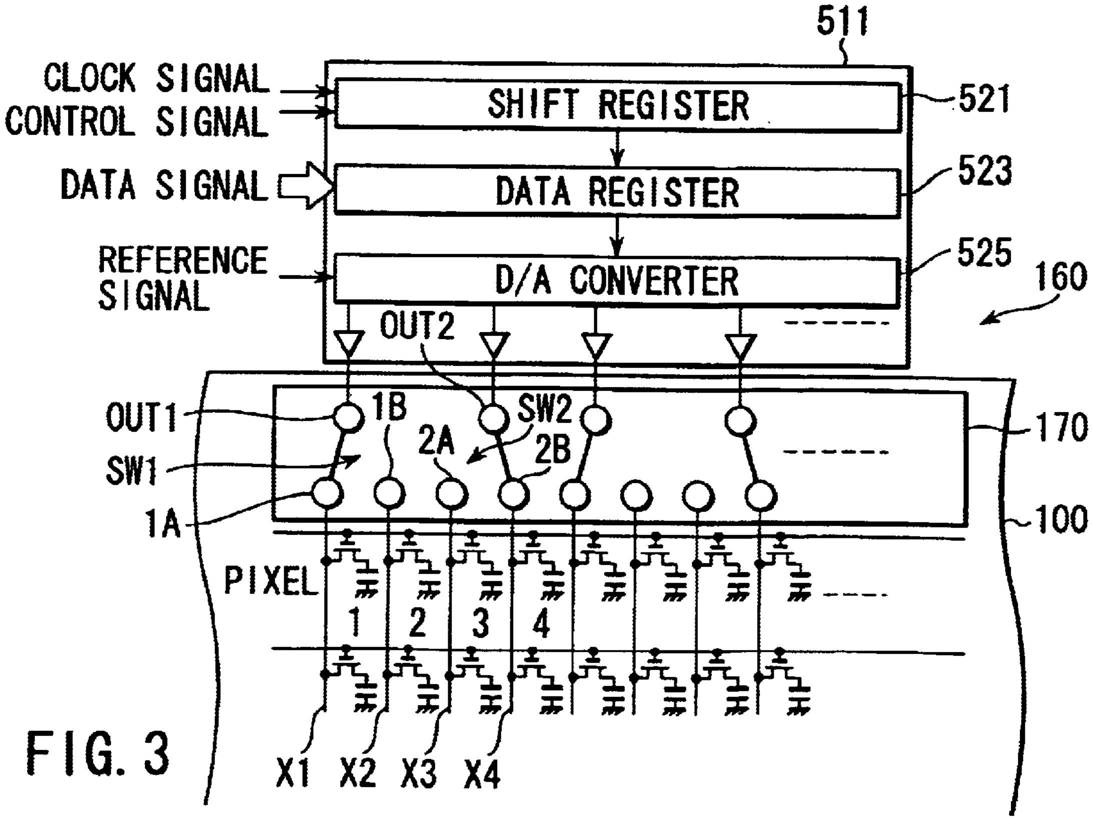
FIG. 3 is a view showing schematically the composition of a signal line drive circuit of the liquid crystal display device shown in FIG. 1.

That is, as shown in FIG. 3, the signal line drive IC 511 is composed of a shift register 521, a data register 523, a D/A converter 525 and the like. Into the shift register a clock signal and a control signal are inputted from the PCB substrate 600 side. Into the data register 523 data signals are inputted from the PCB substrate 600 side. Moreover, into the D/A converter 525 a reference signal is inputted from the PCB substrate 600 side, and the inputted data signals are converted into analog picture signals.

Each analog picture signal outputted from the signal line drive IC 511 of the TCP-N includes an analog picture signal corresponding to two signal lines in each horizontal scanning period. This analog picture signal is outputted in a time series and inputted into a selection circuit 170 of the signal line drive circuit portion 160 formed on the array substrate 100.

The selection circuit 170 is connected to wires from the signal line drive IC 511 and includes switches SW1, SW2, . . . connecting selectively output terminals OUT1, OUT2, . . . onto which each serial analog picture signal outputted from the signal line drive IC with input terminals 1A and 1B, 2A and 2B . . . mounted on one end of the signal lines X1, X2 . . . . Thus, each serial analog picture signal outputted corresponding to two adjacent signal lines from the signal line drive IC 511 in each horizontal scanning period is, as described below, distributed to the two adjacent signal lines sequentially.

In this embodiment, the output terminals OUT are half as many as the signal lines X, and a drive signal is outputted sequentially from one output terminal onto two signal lines. If further reduced connections are desired, the output terminals OUT may be one-third or a quarter as many as the signal lines X.

And, for example, the switch SW1 connects the output terminal OUT1 sequentially with the input terminals 1A and 1B of the signal lines X1 and X2 respectively in a predetermined timing in one horizontal scanning period based on the switching signal. The switch SW1 connects the output terminal OUT1 with the input terminal 1A when the switching signal is a ON timing and connects the output terminal OUT1 with the input terminal 1B when the switching signal is a OFF timing.

The switch SW2 connects the output terminal OUT2 sequentially with the input terminals 2A and 2B of the signal lines X3 and X4 respectively in a predetermined timing in one horizontal scanning period based on the switching signal. The switch SW2 connects the output terminal OUT2 with the input terminal 2B when the switching signal is a ON timing and connects the output terminal OUT2 with the input terminal 2A when the switching signal is a OFF timing.

Like this, by forming the gate line drive circuit integrally on the substrate, by composing the signal line drive circuit of a selection circuit formed integrally on the substrate and of a signal line drive IC mounted on the TCP, and by outputting a drive signal sequentially onto a plurality of signal lines by means of the switches of the selection circuit in one horizontal scanning period, it is not necessary to form connection wires on the array substrate corresponding to the number of signal lines even if highly fine pixels are desired, and a sufficient pitch can be obtained between connection wires.

Moreover, in comparison to a case of forming the gate drive line circuit and the signal line drive circuit together on the substrate, not only a long wiring but also a deteriorated data signal or picture signal and an increase in production cost can be prevented.

Now, a method of driving each signal line X, that is, one example of writing analog picture signals from each signal line into each pixel will be described.

Here, a case of writing picture signals sequentially into a signal line group comprising a pair of adjacent signal lines X1 and X2 connected, for example, in the first half of one horizontal scanning period to the input terminal 1A and in the second half thereof, to the input terminal 1B, will be described.

First, in the first half of one horizontal scanning period, the switch SW1 is connected to the input terminal 1A and analog picture signals are written into the signal line X1. With the analog picture signals being held in the signal line X1, in the second half of one horizontal scanning period, the switch SW1 is connected to the input terminal 1B and the analog picture signals are written into the signal line X2.

At this time, together with potential fluctuation in the signal line X2, there is also generated potential fluctuation in the signal line X1 due to combined capacitance of the signal lines. As a result thereof, in the signal line X1, the potential is fluctuated to a potential which is different from that based upon the analog signals to be written, and a problem may be encountered in displaying.

For example, here, the polarity of a picture signal written into the signal line (potential to the common potential), that is, positive/negative is changed over in each vertical scanning period. Moreover, in case of a V-line reversal drive in which a picture signal having a reversed polarity is written into adjacent signal lines, when an uniform screen is displayed, for example, when displaying black by impressing a voltage, assuming that the common potential is 5V, a voltage of 9V is impressed to the positive side and a voltage of 1V is impressed to the negative side.

If such a problem arises, a potential of 1V is written into the signal line X2 after a potential of 9V has been written into the signal line X1, however, the potential the signal line X1 is fluctuated in a direction of the potential of 9V nearing 5V due to the potential fluctuation of the signal line X2. That is, the level of black varies, and when the fluctuation is large, stripes having different vertical gradations are visible, what causes serious interference with functions as a display device.

Therefore, in this embodiment, by changing the sequence of writing into the signal line at least either in each predetermined vertical scanning period or in each horizontal scanning period, pixels having a fluctuated potential are dispersed in time and space, thereby making the gradation fluctuation of the display screen hard to see.

Figure 4:
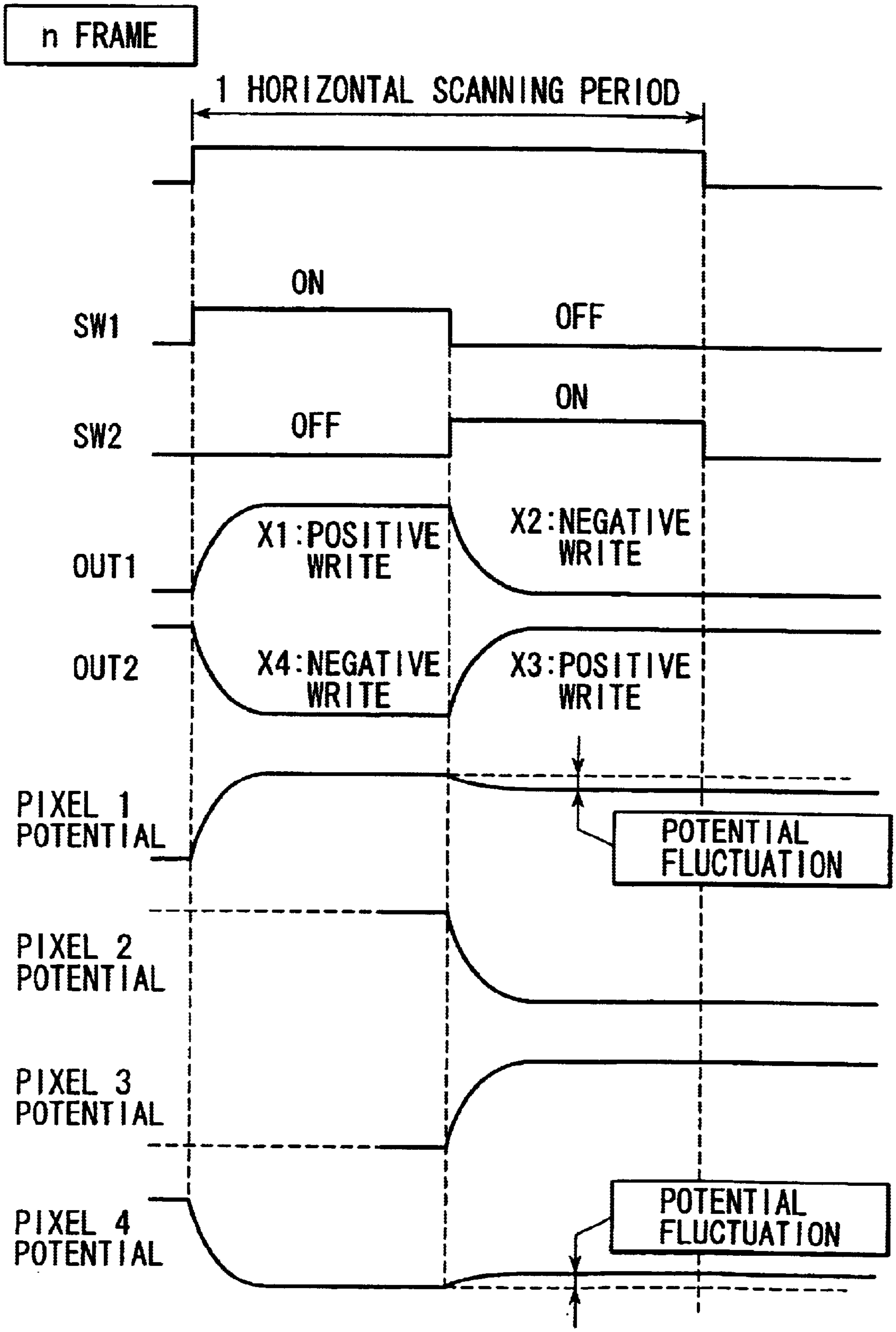
FIG. 4 is a view showing a timing chart in case of writing data signals into each pixel of the liquid crystal display device shown in FIG. 1.

That is, as shown in FIG. 4, in n-frame, a switch signal putting the switch into ON in the first half of one horizontal scanning period and into OFF in the second half thereof is inputted into the switch SW1. Thereby, the output terminal OUT1 is connected to the input terminal 1A in the first half of one horizontal scanning period and is connected to the input terminal 1B in the second half thereof. Moreover, a switch signal putting the switch into OFF in the first half of one horizontal scanning period and into ON in the second half thereof is inputted into the switch SW2. Thereby, the output terminal OUT2 is connected to the input terminal 2B in the first half of one horizontal scanning period and is connected to the input terminal 2A in the second half thereof.

The output signals outputted from the output terminal OUT1 are reversed in the first and second half of one horizontal scanning period. That is, in the first half positive picture signals are written into the signal line X1 via the connected input terminal 1A, and in the second half negative picture signals are written into the signal line X2 via the connected input terminal 1B.

The output signals outputted from the output terminal OUT2 are reversed in the first and second half of one horizontal scanning period. That is, in the first half negative picture signals are written into the signal line X4 via the connected input terminal 2B, and in the second half positive picture signals are written into the signal line X3 via the connected input terminal 2A.

Thereby, positive picture signals are written into a pixel 1 in the first half of one horizontal scanning period and negative picture signals are written into a pixel 2 in the second half thereof. Moreover, positive picture signals are written into a pixel 3 in the second half of one horizontal scanning period and negative picture signals are written into a pixel 4 in the first half thereof.

At this time, the potential written in the first half of one horizontal scanning period is fluctuated due to the influence of the potential written into an adjacent pixel. That is, in the pixel 1 the written potential of 9V is lowered a little due to the influence of the potential written into the pixel 2, and in the pixel 4 the written potential of 1V is raised a little due to the influence of the potential written into the pixel 3.

Figure 5:
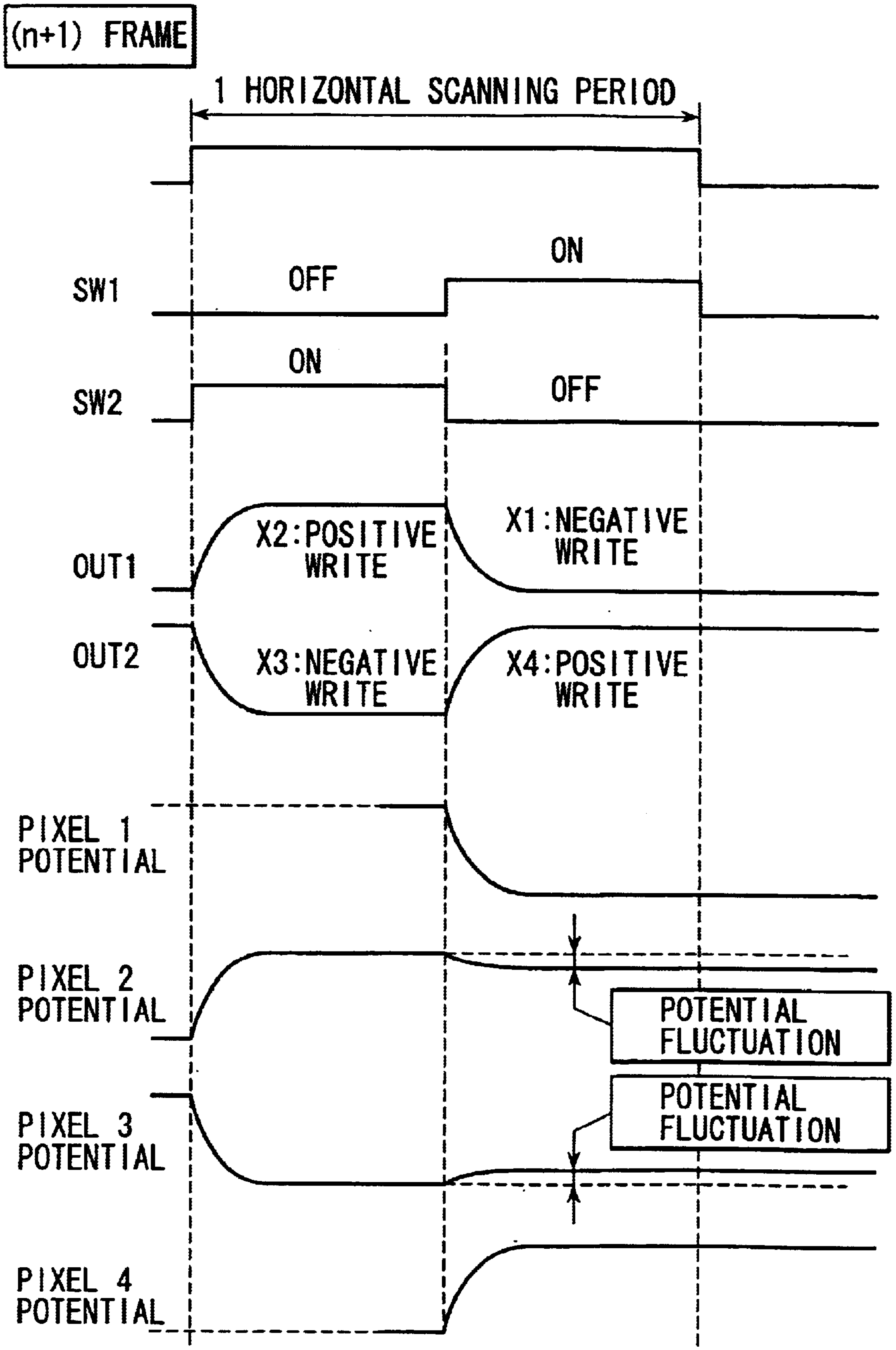
FIG. 5 is a view showing a timing chart in case of writing data signals into each pixel of the liquid crystal display device shown in FIG. 1.

Subsequently, as shown in FIG. 5, in (n+1) frame, a switch signal putting the switch into OFF in the first half of one horizontal scanning period and into ON in the second half thereof is inputted into the switch SW1. Thereby, the output terminal OUT1 is connected to the input terminal 1B in the first half of one horizontal scanning period and is connected to the input terminal 1A in the second half thereof. Moreover, a switch signal putting the switch into ON in the first half of one horizontal scanning period and into OFF in the second half thereof is inputted into the switch SW2. Thereby, the output terminal OUT2 is connected to the input terminal 2A in the first half of one horizontal scanning period and is connected to the input terminal 2B in the second half thereof.

The output signals outputted from the output terminal OUT1 are reversed in the first and second half of one horizontal scanning period. That is, in the first half positive picture signals are written into the signal line X2 via the connected input terminal 1B, and in the second half negative picture signals are written into the signal line X1 via the connected input terminal 1A.

The output signals outputted from the output terminal OUT2 are reversed in the first and second half of one horizontal scanning period. That is, in the first half negative picture signals are written into the signal line X3 via the connected input terminal 2A, and in the second half positive picture signals are written into the signal line X4 via the connected input terminal 2B.

Thereby, negative picture signals are written into a pixel 1 in the second half of one horizontal scanning period and positive picture signals are written into a pixel 2 in the first half thereof. Moreover, negative picture signals are written into a pixel 3 in the first half of one horizontal scanning period and positive picture signals are written into a pixel 4 in the second half thereof.

At this time, in the pixel 2 the written potential of 9V is lowered a little due to the influence of the potential written into the pixel 1, and in the pixel 3 the written potential of 1V is raised a little due to the influence of the potential written into the pixel 4.

As described above, in n-frame, the potentials of the pixel 1 and the pixel 4 are shifted in a direction nearing the common potential, and the black level is lowered in comparison to the pixel 2 and the pixel 3. And, in (n+1) frame, the potentials of the pixel 2 and the pixel 3 are shifted in a direction nearing the common potential, and the black level is lowered in comparison to the pixel 1 and the pixel 4.

Since the other portions on the display screen operates similarly, the black levels of the pixel column connected to the signal line X1 and the pixel column connected to the signal line X2, or the black levels of the pixel column connected to the signal line X3 and the pixel column connected to the signal line X4 are lowered alternately in each frame. As a result thereof, on the whole display screen, the lightened display portions are averaged, and it becomes possible to make the fluctuating display due to the influence of potential fluctuation hard to see. Further, it is also effective to compensate for a written potential in advance in consideration of the above-described potential fluctuation.

Therefore, since the output terminals of the signal line drive IC are less than the signal lines, it becomes possible to reduce the signal drive ICs in number, thereby reducing cost, and even if the signal drive ICs are reduced in number, it becomes also possible to obtain display images without deteriorating the display quality of the screen.

In the above-described embodiment, the selection cycle of a signal line is one vertical scanning period, however, similar effects are obtained also in one horizontal scanning period, and pixels having a fluctuating potential can be dispersed in a checkered pattern. Moreover, the selection cycle of a signal line may be changed in each horizontal scanning period and in each vertical scanning period. In this case, the checkered pattern is replaced in each vertical scanning period, and pixels having a fluctuating potential can be further averaged.

Similarly, the selection cycle of a signal line is not limited to one horizontal scanning period or one vertical scanning period and may be a plurality of scanning periods. For example, the selection cycle of a signal line may be changed to one horizontal scanning period and two vertical scanning periods. That is, in the above-described embodiment, when focusing on a certain pixel, there is an inclination that the potential fluctuates in writing a picture signal having a particular polarity, however, in this case, since the polarity is also replaced sequentially, the generation of the inclination can be controlled.

In the above-described embodiment, TCPs 500-1 to 6 shown in FIG. 1 are all identical and are composed as shown in FIG. 2. That is, the PCB pads 513 of each TCP-N are as many as the connections wires on the PCB substrate 600, and the pitch between the PCB pads 513 is identical to that between the connection wires on the PCB substrates 600. Moreover, the array pads 515 of each TCP-N are as many as the connections wires on the array substrate 100, and the pitch between the array pads 515 is identical to that between the connection wires on the array substrates 100.

This TCP 500-N comprises an input signal wiring group 531 mounted on the signal line drive IC 511 corresponding to input signals from the PCB substrate 600, an output signal wiring group 533 mounted corresponding to output signals from the signal line drive IC 511, and other wiring groups 535 and 537 such as a power source wire for liquid crystal display device, and a power source wire and a switch signal (control signal) wire for switches SWs of selection circuit 170.

As shown in FIG. 2, the input signal wiring group 531 and the output signal wiring group 533 to the signal line drive IC 511 are disposed between the other wiring groups 535 and 537 distributed in an almost equal number of wires.

TCPs 500-1 and 500-6 disposed at both ends of the array substrate 100 comprise respectively a power source wire for gate line drive circuit 150 and a wire for control signal in order to be connected to the gate line drive circuits 150 mounted at both ends of the array substrate 100. As a matter of course, when the gate line drive circuit 150 is mounted only at one end of the array substrate, either TCP 500-1 or 500-6 may comprise a power source wire for gate line drive circuit 150 and a wire for control signal.

As described above, by forming a power source wire for gate line drive circuit, a wire for control signal, a power source wire and a switch signal wire for switches SWs of selection circuit, and a power source wire for liquid crystal display device together with input and output signal wires of signal line drive IC on TCP, no separate wiring materials are required, and a reduction in cost can be attained.

Further, in the above-described embodiment, TCPs 500-1 to 6 are all identical, however, TCPs 500-1 and 500-6 may be composed differently from TCPs 500-2 to 500-5. That is, the connection wires on the array substrate 100 corresponding to the array pads 515 of TCPs 500-2 to 500-5 are less than those of TCPs 500-1 and 500-6. Therefore, in TCPs 500-2 to 500-5, the pitch between the connection wires can be further extended.

More concretely, TCPs 500-1 and 500-6 are composed as shown in FIG. 2 and comprise respectively an input signal wiring group 531 mounted on the signal line drive IC 511 corresponding to input signals from the PCB substrate 600, an output signal wiring group 533 mounted corresponding to output signals from the signal line drive IC 511, and other wiring groups 535 and 537 such as a power source wire for liquid crystal display device, a power source wire and a switch signal (control signal) wire for switches SWs of selection circuit 170, and a power source wire and a control signal wire for gate line drive circuit 150.

As shown in FIG. 2, the input signal wiring group 531 and the output signal wiring group 533 to the signal line drive IC 511 are disposed between the other wiring groups 535 and 537 distributed in an almost equal number of wires.

Figure 6:
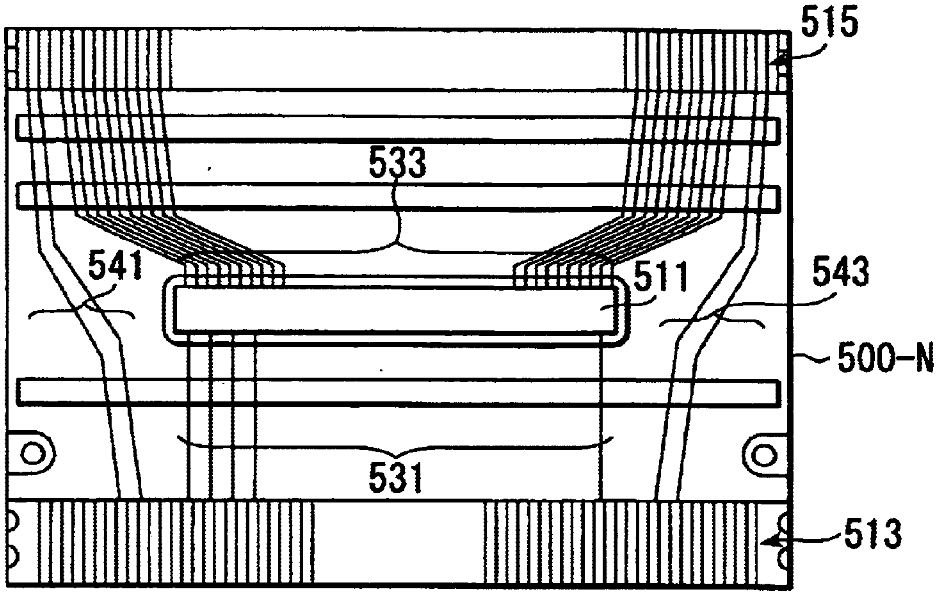
FIG. 6 is a view showing schematically the composition of a TCP mounted on one side of the liquid crystal display device shown in FIG. 1.

TCPs 500-2 to 500-5 are composed as shown in FIG. 6 and comprise respectively an input signal wiring group 531 mounted on the signal line drive IC 511 corresponding to input signals from the PCB substrate 600, an output signal wiring group 533 mounted corresponding to output signals from the signal line drive IC 511, and other wiring groups 541 and 543 such as a power source wire for liquid crystal display device, a power source wire and a switch signal (control signal) wire for switches SWs of selection circuit 170, and a power source wire and a switch signal (control signal) wire for selection drive circuit 170.

As shown in FIG. 6, the input signal wiring group 531 and the output signal wiring group 533 to the signal line drive IC 511 are disposed between the other wiring groups 541 and 543 distributed in an almost equal number of wires.

The other wiring groups 535 and 537 in TCPs shown in FIG. 2 has about 20 to 40 wires respectively, and the other wiring groups 541 and 543 in TCPs shown in FIG. 6 includes about 5 to 20 wires respectively.

Figure 7:
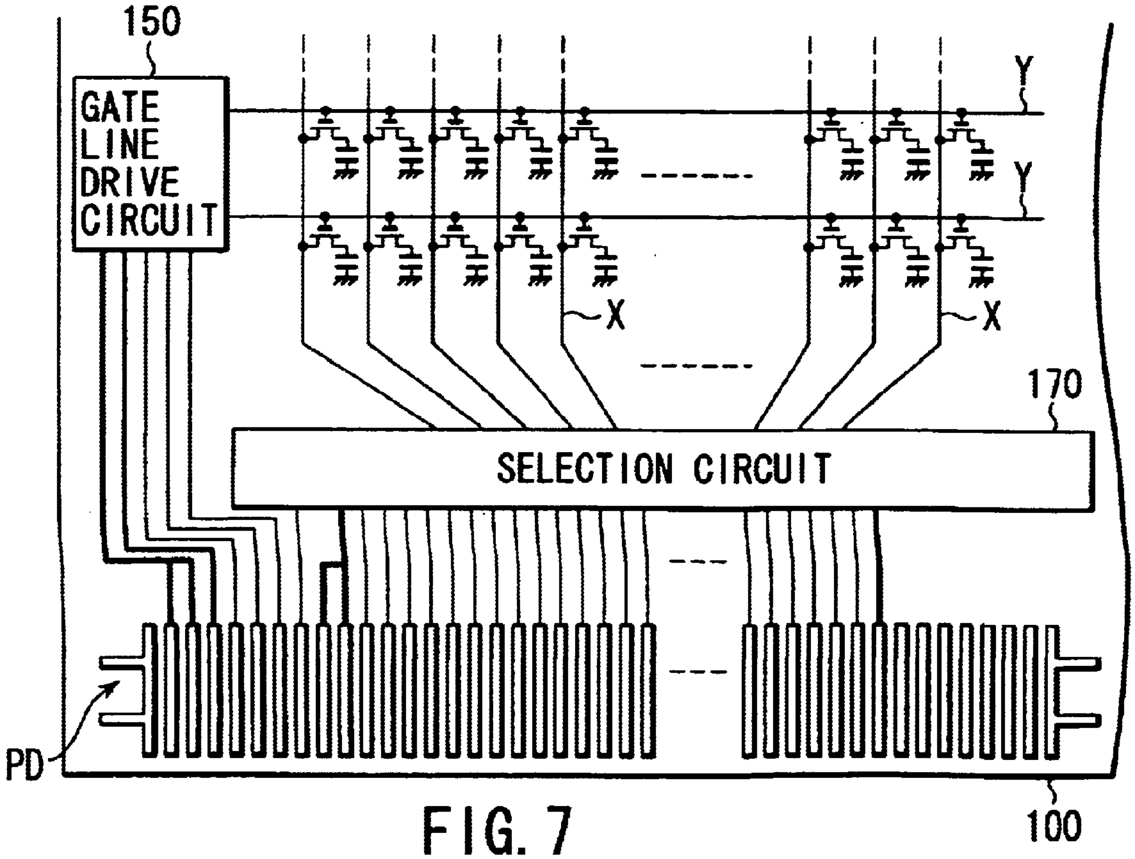
FIG. 7 is a view showing schematically the composition of a wiring pad mounted on one end side of the array substrate of the liquid crystal display device shown in FIG. 1.

As shown in FIG. 7, TCP 500-1 is connected to one end side of the array substrate 100. The array substrate 100 comprises a connection pad group PD along one side of which the array pads 515 of TCP 500-1 are connected. In the central portion of this connection pad group PD, there are mounted pads for inputting output signals from the signal line drive IC, switch signals and power of the switches into the selection circuit 170.

On one end side of the connection pad group PD, there are mounted pads for inputting power and control signals mainly into the gate line drive circuit 150. The control signals supplied from these pads includes a clock signal, a start signal and a reset signal, for example, when the gate line drive circuit 150 is composed of a shift register. Moreover, the power of the liquid crystal display device may be supplied from these pads as occasion demands.

Figure 8:
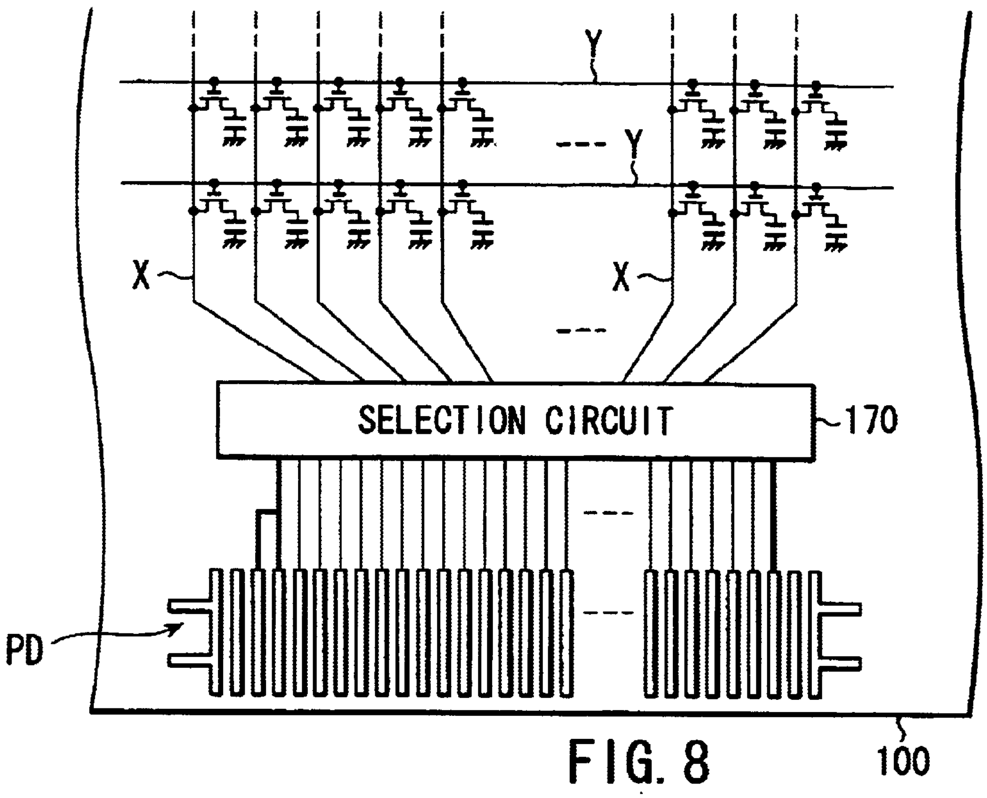
FIG. 8 is a view showing schematically the composition of a wiring pad mounted in the central portion of the array substrate of the liquid crystal display device shown in FIG. 1.

As shown in FIG. 8, TCPs 500-2 to 500-5 are connected to the central portion along one side of the array substrate 100. The array substrate 100 comprises a connection pad group PD along one side of which the array pads 515 of TCP 500-2 to 500-5 are connected. In this connection pad group PD, there are mounted pads for inputting output signals from the signal line drive IC, switch signals and power of the switches into the selection circuit 170.

Figure 9:
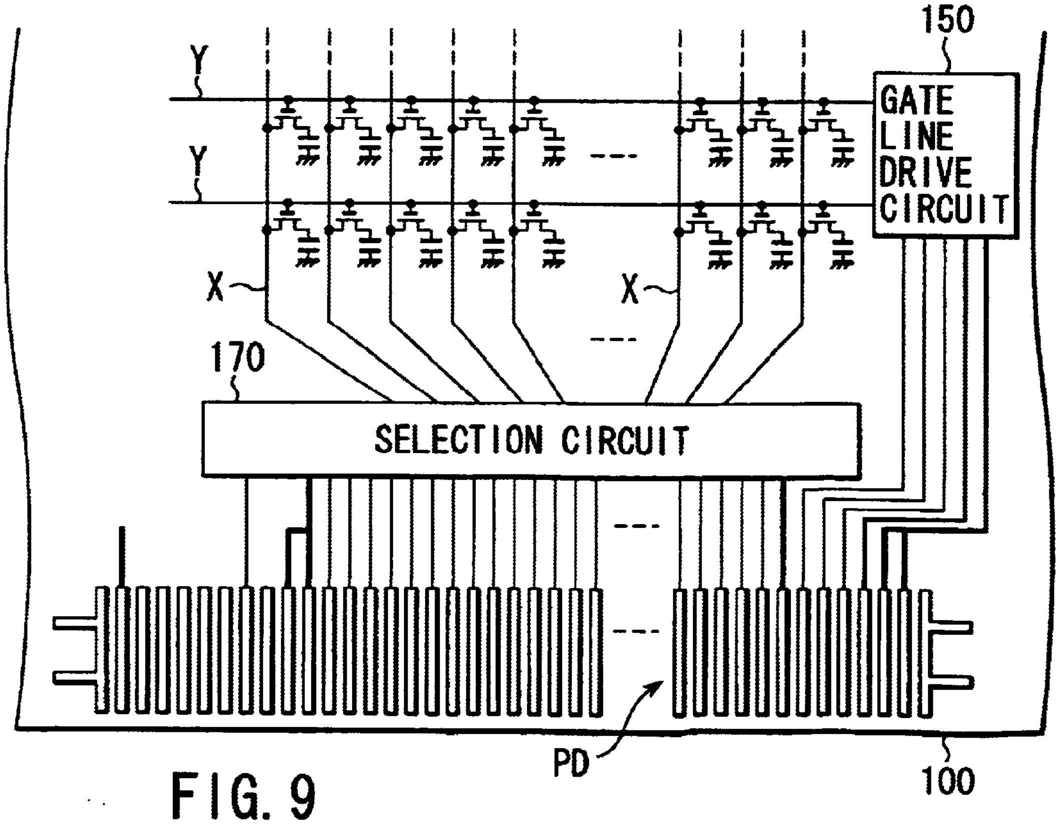
FIG. 9 is a view showing schematically the composition of a wiring pad mounted on the other end side of the array substrate of the liquid crystal display device shown in FIG. 1.

As shown in FIG. 9, TCP 500-6 is connected to the other end side of the array substrate 100. The array substrate 100 comprises a connection pad group PD along one side of which the array pads 515 of TCP 500-5 are connected. In the central portion of this connection pad group PD, there are mounted pads for inputting output signals from the signal line drive IC, switch signals and power of the switches into the selection circuit 170.

On the other end side of the connection pad group PD, there are mounted pads for inputting power and control signals mainly into the gate line drive circuit 150. Moreover, the power of the liquid crystal display device may be supplied from these pads as occasion demands.

Due to the above-described composition, TCP 500-2 to 500-5 require only wires for inputting power and switch signals for the switches SW of the selection circuit 170 in addition to the wires inputting output signals from the signal line drive IC and can reduce the wires to be connected in number in comparison to TCPs 500-1 and 500-6. Therefore, highly fine pixels can be realized without lowering the reliability.

Now, a first inspection method of inspecting a short circuit in the signal lines X (1, 2, 3 . . . ) of the array substrate 100 in the above-described display device will be described. Further, this inspection method is carried out before a color filter layer 24, a pixel electrode 151, an alignment layer 13 and the like are formed when the array substrate 100 is composed as shown in FIG. 17.

Figure 17:
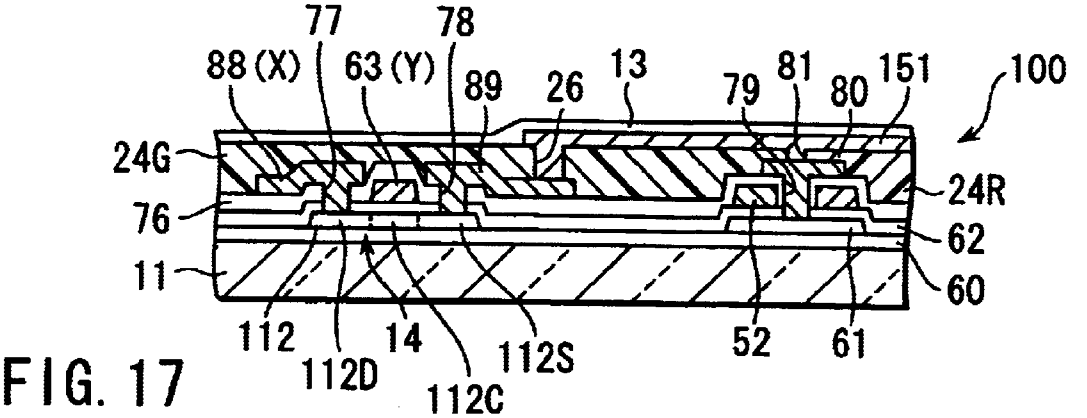
FIG. 17 is a view showing schematically the composition of a liquid crystal apparatus according to one embodiment of the present invention.

That is, the array substrate 100 composed as shown in FIG. 17 is formed in the following sequence. First, an undercoat layer 60, a semiconductor layer 112 of the TFT 14 and an storage capacitance electrode 61, a gate insulation film 62, a gate electrode 63 integrated with the gate line Y and an storage capacitance line 52, and an interlayer insulation film 76 are formed sequentially on a transparent glass substrate 11. Subsequently, a drain electrode 88 being integrated with the signal line X and having made a contact with a drain area 112D of the semiconductor layer 112, a source electrode 89 having made a contact with a source area 112S of the semiconductor layer 112, and a contact electrode 80 having made a contact with the storage capacitance electrode 61 are formed sequentially on the interlayer insulation film 76. And subsequently, a color filter layer 24, a pixel electrode 151 and an alignment layer 13 are formed sequentially.

The storage capacitance electrode 61 and the storage capacitance line 52 opposed to each other via the gate insulation film 62 compose an storage capacitance element 130 and form an storage capacitance, that is, a pixel capacitance.

This inspection method is carried out, for example, in a timing before forming the color filter layer 24 of the array substrate 100. Thereby, an array substrate having any defective signal line can be removed before being fed to the next process, and useless work can be reduced. Moreover, other second to fifth inspection methods described later are carried out in a similar timing.

Figure 10:
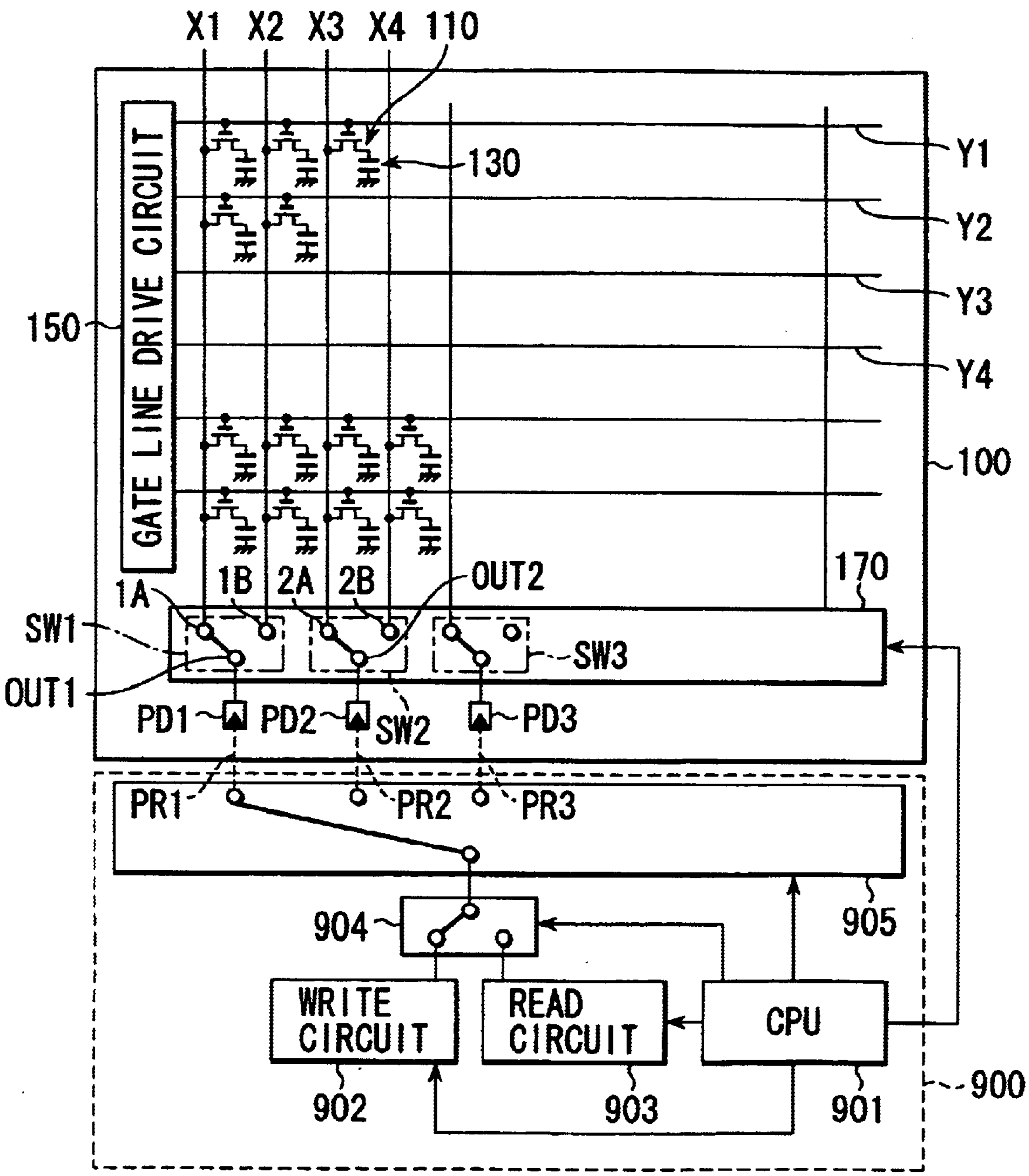
FIG. 10 is a view showing schematically the circuit composition in case of writing signals when a short circuit between two signal lines is inspected in a first inspection method according to the present invention.
Figure 11:
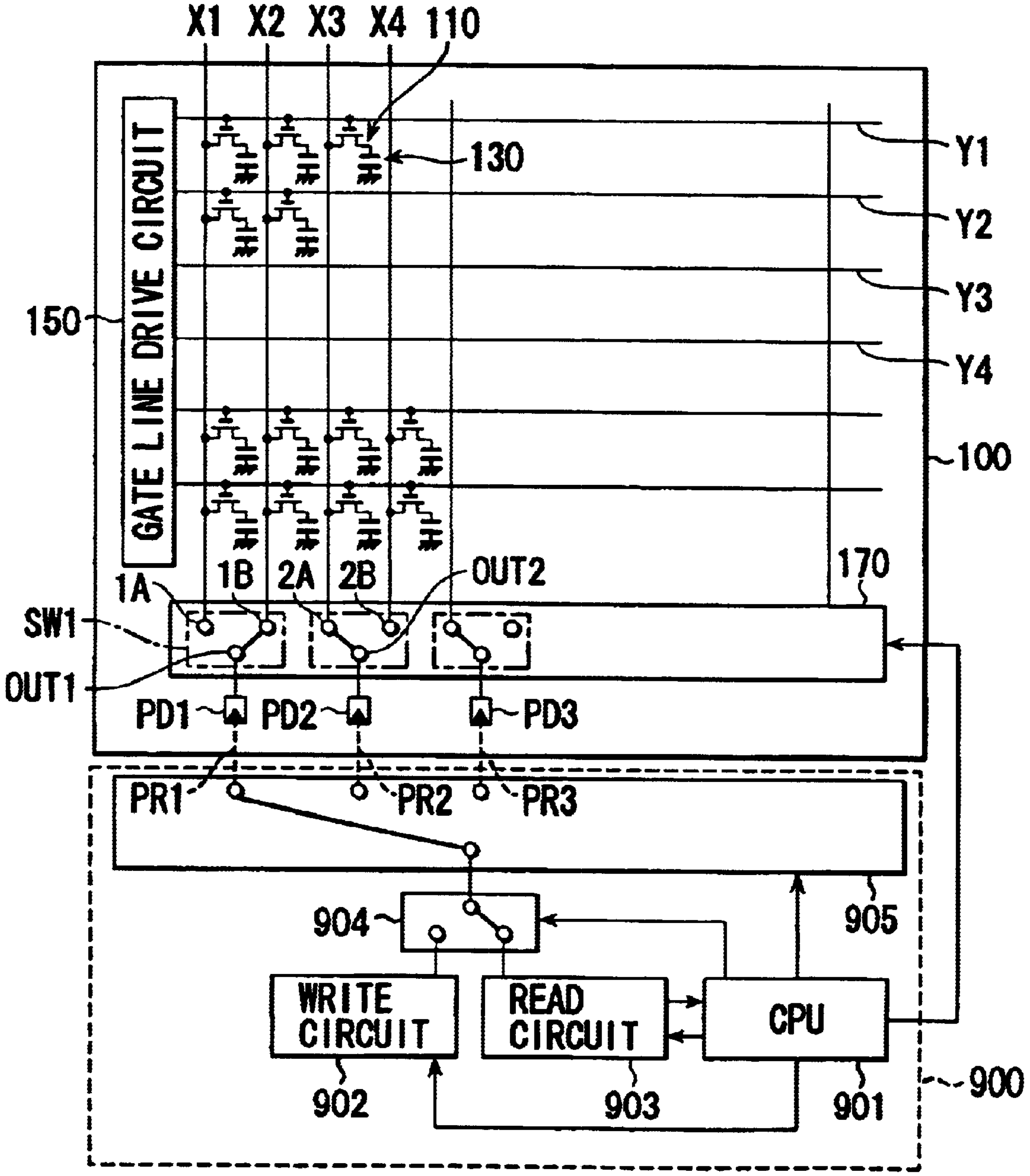
FIG. 11 is a view showing schematically the circuit composition in case of reading signals when a short circuit between two signal lines is inspected in a first inspection method according to the present invention.

As shown in FIGS. 10 and 11, first, an inspection circuit 900 is connected to the array substrate 100. This inspection circuit 900 comprises a CPU 901 controlling inner circuits and switches, a write circuit 902 writing analog signals into the signal lines, a read circuit 903 reading signals outputted from the signal lines, a first switch 904 selecting the write circuit 902 and the read circuit 903, probes PRs (1, 2, 3 . . . ) connected to the connection pads PDs (1, 2, 3 . . . ) respectively, and a second switch 905 selecting the probes PRs.

CPU 901 outputs control signals onto the write circuit 902, the read circuit 903, the first switch 904, the second switch 905 and the selection circuit 170 of the array substrate 100 respectively in a predetermined timing.

First, a method of inspecting a short circuit between a first signal line X1 and a second signal line X2 adjacent to each other will be described. The first signal line X1 and the second signal line X2 are selected by means of the same switch SW1 of the selection circuit 170, and analog signals are written and read via the same connection pads PD1.

That is, in a first signal line selection period selecting the first signal line X1, as shown in FIG. 10, CPU 901 outputs a control signal for selecting the write circuit 902 onto the first-switch 904, and a control signal for selecting the probe PR1 connected to the connection pad PD1 onto the second switch 905. Moreover, CPU 901 outputs a control signal for connecting the output terminal OUT1 of the switch SW1 to the input terminal 1A of the first signal line X1 onto the selection circuit 170.

In this first signal line selection period, CPU 901 controls the write circuit 902 and writes a predetermined analog signal into the first signal line X1.

Subsequently, in a second signal line selection period selecting the second signal line X2 adjacent to the first signal line X1, as shown in FIG. 11, CPU 901 outputs a control signal for selecting the read circuit 903 onto the first switch 904, and a control signal for selecting the probe PR1 connected to the connection pad PD1 onto the second switch 905. Moreover, CPU 901 outputs a control signal for connecting the output terminal OUT1 of the switch SW1 to the input terminal 1B of the second signal line X2 onto the selection circuit 170.

In this second signal line selection period, CPU 901 controls the read circuit 903 and reads output signals from the second signal line X2.

When the predetermined analog signal has been detected from the second signal line X2, CPU 901 judges that there is a short circuit between the first signal line X1 and the second signal line X2, and when the predetermined analog signal has not been detected from the second signal line X2, CPU 901 judges that there is no short circuit between the first signal line X1 and the second signal line X2.

Next, a method of inspecting a short circuit between a second signal line X2 and a third signal line X3 adjacent to each other will be described. The second signal line X2 and the third signal line X3 are selected by means of the different switches of the selection circuit 170, that is, by means of the switches SW1 and SW2, and analog signals are written and read via the connection pads PD1 and PD2 connected to the switches SW1 and SW2 respectively.

That is, in a second signal line selection period selecting the second signal line X2, CPU 901 outputs not only a control signal for selecting the write circuit 902 onto the first switch 904, but also a control signal for selecting the probe PR1 connected to the connection pad PD1 onto the second switch 905. Moreover, CPU 901 outputs a control signal for connecting the output terminal OUT1 of the switch SW1 to the input terminal 1B of the second signal line X2 onto the selection circuit 170.

In this second signal line selection period, CPU 901 controls the write circuit 902 and writes a predetermined analog signal into the second signal line X2.

Subsequently, in a third signal line selection period selecting the third signal line X3 adjacent to the second signal line X2, CPU 901 outputs a control signal for selecting the read circuit 904 onto the first switch 904, and a control signal for selecting the probe PR2 connected to the connection pad PD2 onto the second switch 905. Moreover, CPU 901 outputs a control signal for connecting the output terminal OUT2 of the switch SW2 to the input terminal 2A of the third signal line X3 onto the selection circuit 170.

In this third signal selection period, CPU 901 controls the read circuit 903 and reads output signals from the third signal line X3.

When the predetermined analog signal has been detected from the third signal line X3, CPU 901 judges that there is a short circuit between the second signal line X2 and the third signal line X3, and when the predetermined analog signal has not been detected from the third signal line X3, CPU 901 judges that there is no short circuit between the second signal line X2 and the third signal line X3.

Now, as described above, with two adjacent signal lines being paired, by writing an analog signal into one signal line in one signal line selection period, and by reading an output signal from the other signal line in the next signal line selection period, a short circuit between the paired signal lines can be detected.

Therefore, it becomes possible to reduce the inspection pads to half as many as the conventional ones, and even if highly fine pixels are realized, space for disposing the pads can be secured easily, and it becomes also possible to utilize the advantage of using the polycrystalline silicon TFT effectively.

Moreover, due to the reduced number of the inspection pads, the probes can be also reduced in number, and it becomes possible to provide an easy maintenance inspection circuit without an increase in cost.

Now, a second inspection method of inspecting breaking of signal lines X (1, 2, 3 . . . ) of the array substrate 100 in the above-described display device will be described.

Figure 12:
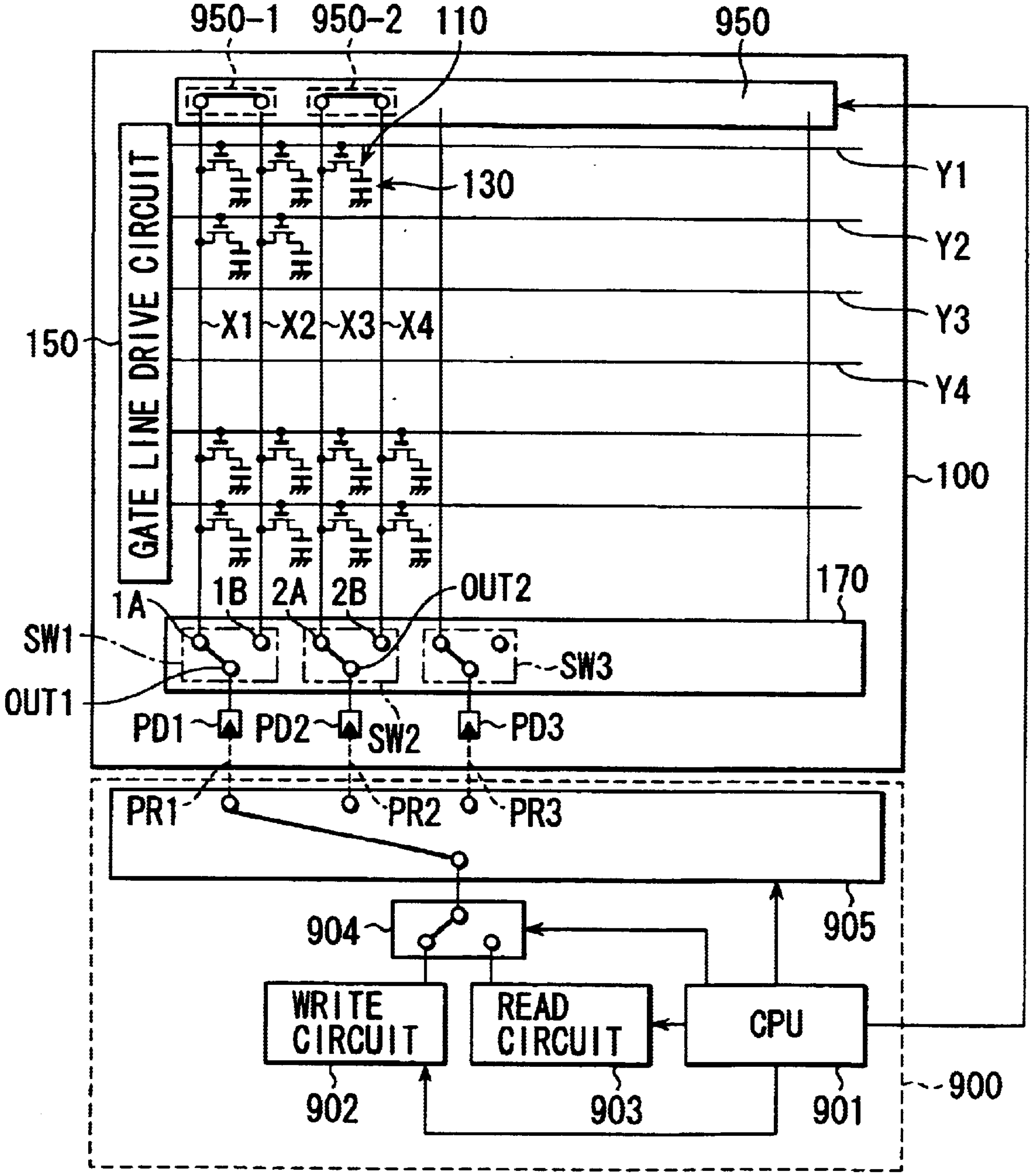
FIG. 12 is a view showing schematically the circuit composition in case of writing signals when breaking of a wire between two signal lines is inspected in a second inspection method according to the present invention.
Figure 13:
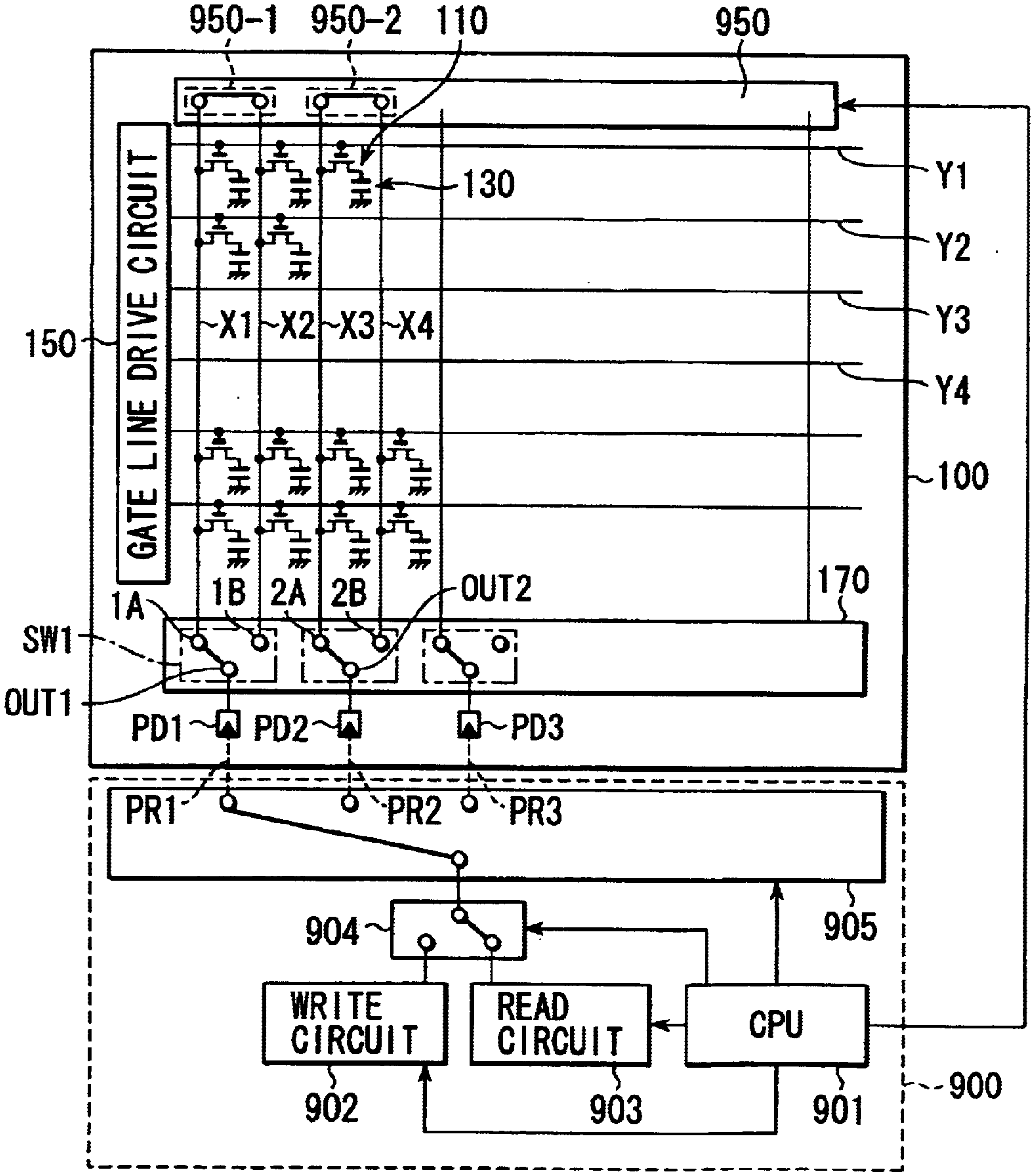
FIG. 13 is a view showing schematically the circuit composition in case of reading signals when breaking of a wire between two signal lines is inspected in a second inspection method according to the present invention.

First, as shown in FIGS. 12 and 13, an inspection circuit 900 is connected to the array substrate 100. CPU 901 of this inspection circuit 900 outputs control signals onto the write circuit 902, the read circuit 903, the first switch 904, the second switch 905, the selection circuit 170 of the array substrate 100, and the distribute circuit 950 of the array substrate 100 respectively in a predetermined timing.

The selection circuit 170 formed integrally with the array substrate 100 is disposed at one end of each signal line X (1, 2, 3 . . . ), and the distribute circuit 950 formed integrally with the array substrate 100 is disposed on the other end of each signal line (1, 2, 3 . . . ). This distribute circuit 950 has switches 950-1, 950-2 . . . putting the continuity between the adjacent signal lines into ON/OFF.

First, a method of inspecting breaking of a first signal line X1 and a second signal line X2 adjacent to each other will be described. These first signal line X1 and second signal line X2 are selected by means of the same switch SW1 of the selection circuit 170, and analog signals are written and read via the same connection pads PD1.

That is, in a first signal line selection period selecting the first signal line X1, as shown in FIG. 12, CPU 901 outputs a control signal for selecting the write circuit 902 onto the first switch 904, and a control signal for selecting the probe PR1 connected to the connection pad PD1 onto the second switch 905.

Moreover, CPU 901 outputs a control signal for connecting the output terminal OUT1 of the switch SW1 to the input terminal 1A of the first signal line X1 onto the selection circuit 170. And further, CPU outputs a control signal for putting the switch 950-1 into ON onto the distribute circuit 950 so that continuity may be established between the first signal line X1 and the second signal line X2.

In this first signal line selection period, CPU 901 controls the write circuit 902 and writes a predetermined analog signal into the first signal line X1.

Subsequently, in a second signal line selection period selecting the second signal line X2 adjacent to the first signal line X1, as shown in FIG. 13, CPU 901 outputs a control signal for selecting the read circuit 904 onto the first switch 904, and a control signal for selecting the probe PR1 connected to the connection pad PD1 onto the second switch 905.

Moreover, CPU 901 outputs a control signal for connecting the output terminal OUT1 of the switch SW1 to the input terminal 1B of the second signal line X2 onto the selection circuit 170. And further, CPU outputs a control signal for putting the switch 950-1 into ON onto the distribute circuit 950 so that continuity may be established between the first signal line X1 and the second signal line X2.

In this second signal line selection period, CPU 901 controls the read circuit 903 and reads output signals from the second signal line X2.

When the predetermined analog signal has been detected from the second signal line X2, CPU 901 judges that there is no breaking of wire in the first signal line X1 and the second signal line X2, and when the predetermined analog signal has not been detected from the second signal line X2, CPU 901 judges that there is breaking of wire at least either in the first signal line X1 or the second signal line X2.

Now, as described above, two adjacent signal lines such as a third signal line X3 and a fourth signal line X4, and a fifth signal line X5 and a sixth signal line X6 . . . are paired, continuity is established between these paired signal lines, an analog signal is written into one signal line in one signal line selection period, and an output signal is read from the other signal line in the next signal line selection period. Thereby, breaking of wire in the paired signal lines can be detected.

Therefore, it becomes possible to reduce the inspection pads to half as many as the conventional ones, and even if highly fine pixels are realized, space for disposing the pads can be secured easily, and it becomes also possible to utilize the advantage of using the polycrystalline silicon TFT effectively.

Moreover, due to the reduced number of the inspection pads, the probes can be also reduced in number, and it becomes possible to provide an easy maintenance inspection circuit without an increase in cost.

As described above, according to the present invention, there can be provided an array substrate of a display device being capable of realizing highly fine pixels. Moreover, according to the present invention, there can be provided a method of inspecting an array substrate for detecting a short circuit and breaking of a wire certainly without an increase in cost by using an easy maintenance inspection circuit.

Now, a third inspection method of inspecting a short circuit in the signal lines X (1, 2, 3 . . . ) of the array substrate 100 in the above-described display device will be described.

Figure 14:
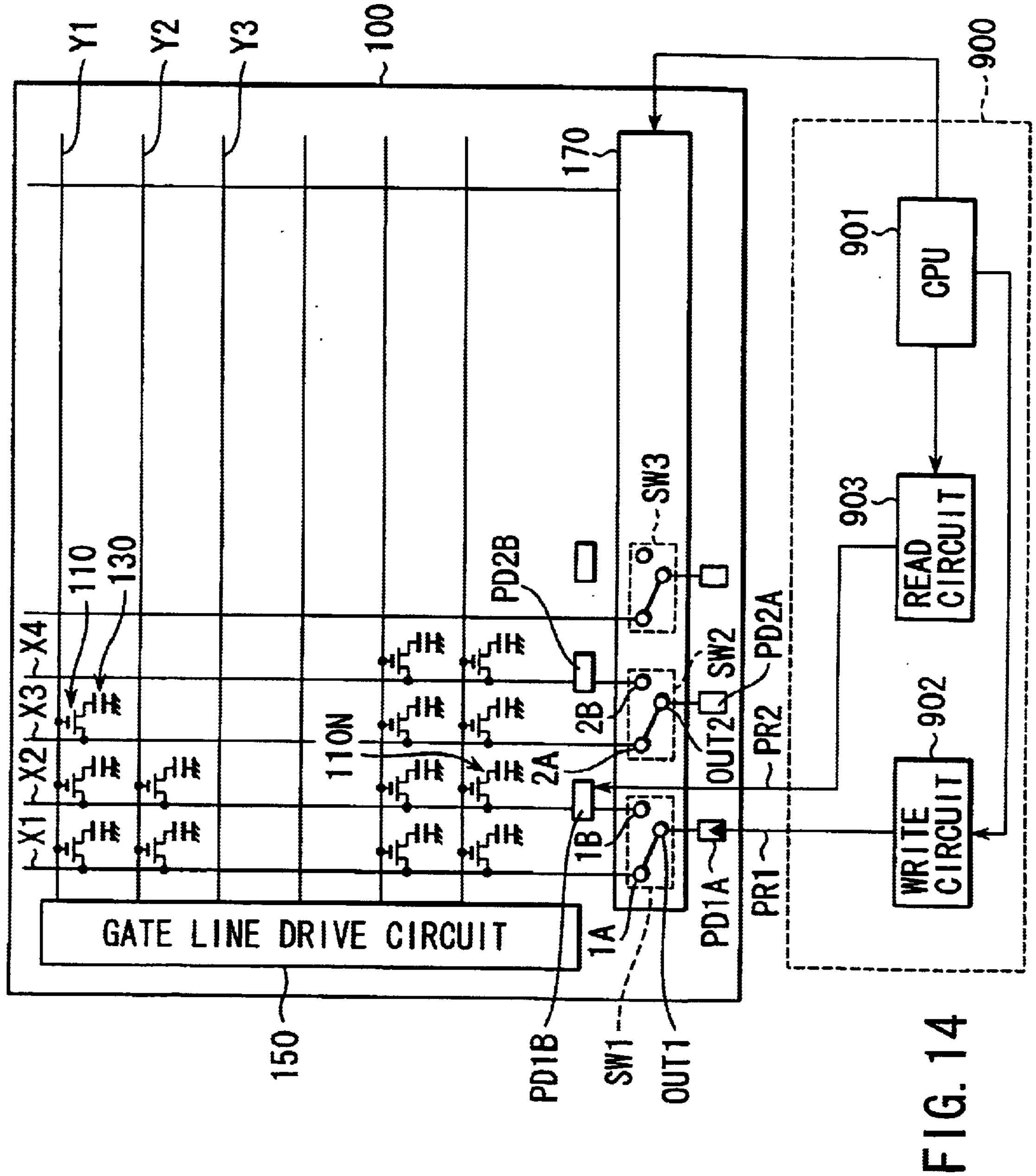
FIG. 14 is a view showing schematically the circuit composition for inspecting a short circuit between two signal lines in a third inspection method according to the present invention.

As shown in FIG. 14, an inspection circuit 900 is connected to the array substrate 100. This inspection circuit 900 comprises a CPU 901 controlling inner circuits and switches, a write circuit 902 writing analog signals into the signal lines, a read circuit 903 reading signals outputted from the signal lines, and probes PRs (1, 2) connected to the connection pads PDs (1, 2, 3 . . . ) respectively.

CPU 901 of the inspection circuit 900 outputs control signals onto the write circuit 902, the read circuit 903 and the selection circuit 170 of the array substrate 100 respectively in a predetermined timing.

On the other hand, the array substrate 100 comprises, on the signal line, an inspection pads PD1B (2B, 3B, . . . ) disposed between the switch SW (1, 2, . . . ) and the pixel transistor 110N nearest to this switch. That is, this inspection pad PD1B is connected electrically to the signal line X2 and disposed between the input terminal 1B of the switch SW1 included in the selection circuit 170 and the pixel transistor 110N.

Similarly, the inspection pad PD2B . . . is also disposed between the switch of the selection circuit 170, for example, on the even-th signal line X2*n* (n=1, 2, . . . ) and the pixel transistor nearest to this switch.

First, a method of inspecting a short circuit between a first signal line X1 and a second signal line X2 adjacent to each other will be described. The first signal line X1 and the second signal line X2 are selected by means of the same switch SW1 of the selection circuit 170, and analog signals are written and read via the same connection pads PD1.

That is, as shown in FIG. 14, the first probe PR1 is connected to the connection pad PD1A, and the second probe PR2 is connected to the connection pad PD1B.

And CPU 901 of the inspection circuit 900 outputs a control signal for connecting the output terminal OUT1 of the switch SW1 to the input terminal 1A of the first signal line X1 onto the selection circuit 170.

And CPU 901 controls the write circuit 902 and write a predetermined analog signal into the first signal line X1 via the first probe PR1.

Subsequently, CPU 901 controls the read circuit 903 and reads output signals from the signal line X2 via the second probe PR2.

When the predetermined analog signal has been detected from the second signal line X2, CPU 901 judges that there is a short circuit between the first signal line X1 and the second signal line X2, and when the predetermined analog signal has not been detected from the second signal line X2, CPU 901 judges that there is no short circuit between the first signal line X1 and the second signal line X2.

Next, a method of inspecting a short circuit between a second signal line X2 and a third signal line X3 adjacent to each other will be described. The second signal line X2 and the third signal line X3 are selected by means of the different switches of the selection circuit 170, that is, by means of the switches SW1 and SW2, and analog signals are written and read via the connection pads PD1A and PD2A connected to the switches SW1 and SW2 respectively.

At this time, the first probe PR1 is connected to the connection pad PD2A.

That is, CPU 901 outputs a control signal for connecting the output terminal OUT2 of the switch SW2 to the input terminal 2A of the third signal line X3 onto the selection circuit 170.

And CPU 901 controls the write circuit 902 and write a predetermined analog signal into the third signal line X3 via the first probe PR1.

Subsequently, CPU 901 controls the read circuit 903 and reads output signals from the second signal line X2 via the second probe PR2.

When the predetermined analog signal has been detected from the second signal line X2, CPU 901 judges that there is a short circuit between the second signal line X2 and the third signal line X3, and when the predetermined analog signal has not been detected from the second signal line X2, CPU 901 judges that there is no short circuit between the second signal line X2 and the third signal line X3.

Now, similarly, with two adjacent signal lines being paired, one probe of the inspection circuit being connected to a connection pad, the other pad being connected to an inspection pad mounted on the signal line, and with the connection pad connected to one probe being connected electrically to one signal line, by writing an analog signal into this one signal line and by reading an output signal from the other output signal connected electrically to the inspection pad, a short circuit between the paired signal lines can be detected.

As described above, by using a part or all of the connection pads as inspection pad, it becomes possible to suppress an increase in inspection pads, and even if highly fine pixels are realized, space for disposing the pads can be secured easily, and it becomes also possible to utilize the advantage of using the polycrystalline silicon TFT effectively.

Moreover, since an increase in probes can be suppressed or a sufficiently wide distance can be obtained between probes, it becomes possible to provide an easy maintenance inspection circuit without an increase in cost.

Now, a fourth inspection method of inspecting a short circuit in the signal lines X (1, 2, 3 . . . ) of the array substrate 100 in the above-described display device will be described.

Figure 15:
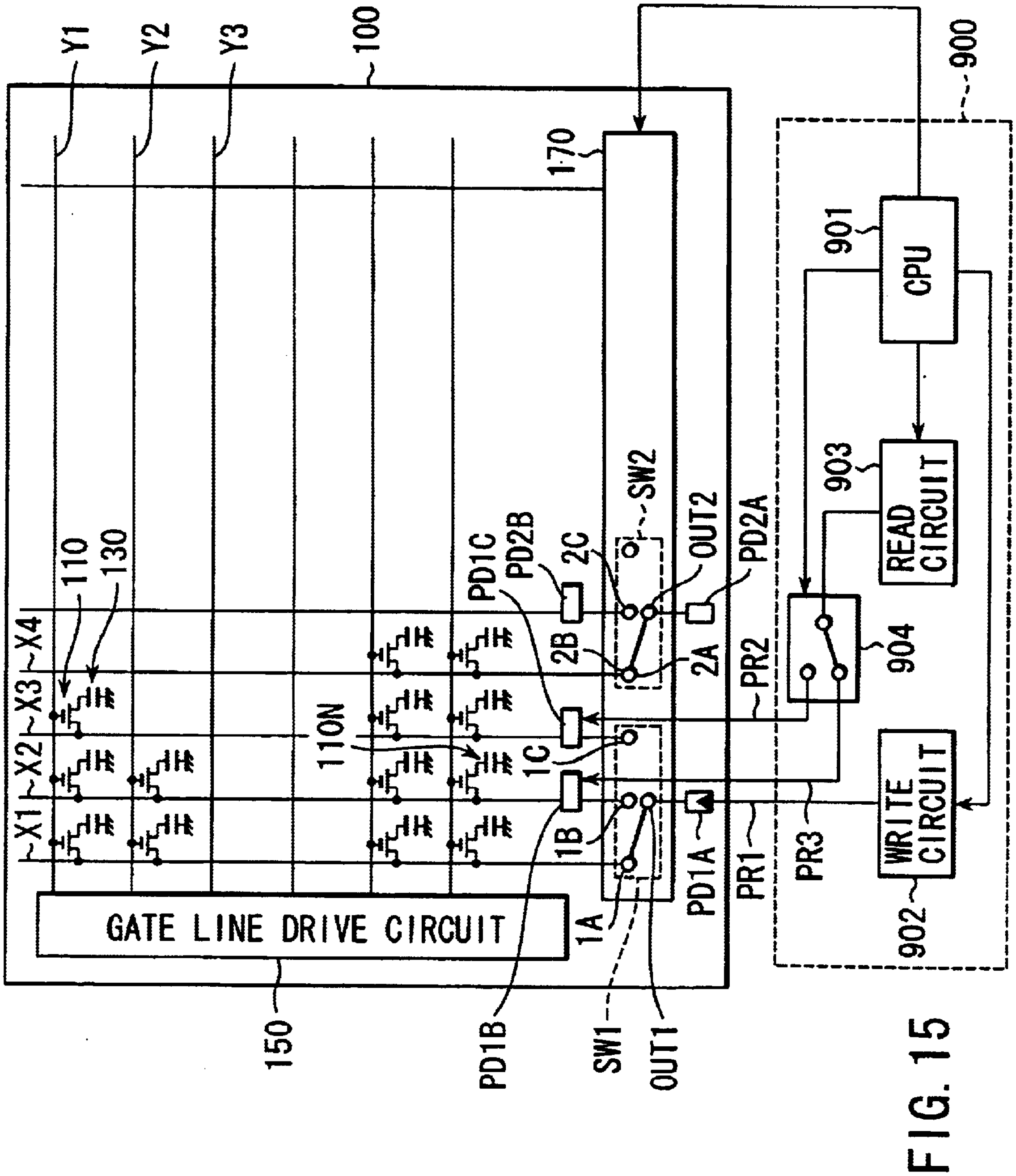
FIG. 15 is a view showing schematically the circuit composition for inspecting a short circuit between two signal lines in a fourth inspection method according to the present invention.

First, as shown in FIG. 15, an inspection circuit 900 is connected to the array substrate 100. This inspection circuit 900 comprises a CPU 901 controlling inner circuits and switches, a write circuit 902 writing analog signals into the signal lines, a read circuit 903 reading signals outputted from the signal lines, probes PRs (1, 2, 3) connected to the connection pads PDs (1, 2, 3 . . . ) respectively, and a distribute circuit 904 changing over from the second probe PR2 to the third probe PR3 or vice versa.

CPU 901 of the inspection circuit 900 outputs control signals onto the write circuit 902, the read circuit 903, the distribute circuit 904, and the selection circuit 170 of the array substrate 100 respectively in a predetermined timing.

On the other hand, on the array substrate 100, each switch SW (1, 2, . . . ) of the selection circuit 170 is formed so as to be capable of selecting input terminals 1A, 1B and 1C corresponding to three signal lines X1, X2 and X3 for one output terminal OUT1. Moreover, the array substrate 100 comprises, on the signal line, an inspection pads PD1B, PD1C (PD2B, PD2C, . . . ) disposed between the switch SW (1, 2, . . . ) and the pixel transistor 110N nearest to this switch.

First, a method of inspecting a short circuit between a first signal line X1 and a second signal line X2 adjacent to each other will be described. The first signal line X1 and the second signal line X2 are selected by means of the same switch SW1 of the selection circuit 170, and analog signals are written via the same connection pads PD1A.

That is, as shown in FIG. 15, the first probe PR1 is connected to the connection pad PD1A, and the second probe PR2 is connected to the inspection pad PD1C. And the third probe PR3 is connected to the connection pad PD1B.

And CPU 901 of the inspection circuit 900 outputs a control signal for connecting the output terminal OUT1 of the switch SW1 to the input terminal 1A of the first signal line X1 onto the selection circuit 170. Moreover, CPU 901 outputs a control signal for selecting the third probe PR3 onto the distribute circuit 904.

And CPU 901 controls the write circuit 902 and write a predetermined analog signal into the first signal line X1 via the first probe PR1.

Subsequently, CPU 901 controls the read circuit 903 and reads output signals from the signal line X2 via the third probe PR3.

When the predetermined analog signal has been detected from the second signal line X2, CPU 901 judges that there is a short circuit between the first signal line X1 and the second signal line X2, and when the predetermined analog signal has not been detected from the second signal line X2, CPU 901 judges that there is no short circuit between the first signal line X1 and the second signal line X2.

Now, a method of inspecting a short circuit between a second signal line X2 and a third signal line X3 adjacent to each other will be described. The second signal line X2 and the third signal line X3 are selected by means of the same switch SW1 of the selection circuit 170, and analog signals are written via the same connection pads PD1A.

That is, CPU 901 outputs a control signal for connecting the output terminal OUT1 of the switch SW1 to the input terminal 1B of the second signal line X2 onto the selection circuit 170. Moreover, CPU 901 outputs a control signal for selecting the second probe PR2 onto the distribute circuit 904.

And CPU 901 controls the write circuit 902 and write a predetermined analog signal into the second signal line X2 via the first probe PR1.

Subsequently, CPU 901 controls the read circuit 903 and reads output signals from the third signal line X3 via the second probe PR2.

When the predetermined analog signal has been detected from the third signal line X3, CPU 901 judges that there is a short circuit between the second signal line X2 and the third signal line X3, and when the predetermined analog signal has not been detected from the third signal line X3, CPU 901 judges that there is no short circuit between the second signal line X2 and the third signal line X3.

Next, a method of inspecting a short circuit between a third signal line X3 and a fourth signal line X4 adjacent to each other will be described. The third signal line X3 and the fourth signal line X4 are selected by means of the different switches of the selection circuit 170, that is, by means of the switches SW1 and SW2, and analog signals are written and read via the connection pads PD1A and PD2A connected to the switches SW1 and SW2 respectively.

At this time, the first probe PR1 is connected to the connection pad PD2A.

That is, CPU 901 outputs a control signal for connecting the output terminal OUT2 of the switch SW2 to the input terminal 2A of the fourth signal line X4 onto the selection circuit 170. Moreover, CPU 901 outputs a control signal for selecting the second probe PR2 onto the selection circuit 904.

And CPU 901 controls the write circuit 902 and write a predetermined analog signal into the fourth signal line X4 via the first probe PR1.

Subsequently, CPU 901 controls the read circuit 903 and reads output signals from the third signal line X3 via the second probe PR2.

When the predetermined analog signal has been detected from the third signal line X3, CPU 901 judges that there is a short circuit between the third signal line X3 and the fourth signal line X4, and when the predetermined analog signal has not been detected from the third signal line X3, CPU 901 judges that there is no short circuit between the third signal line X3 and the fourth signal line X4.

Now, similarly, with two adjacent signal lines being paired, one probe of the inspection circuit being connected to a connection pad, the other pad being connected to an inspection pad mounted on the signal line, and with the connection pad connected to one probe being connected electrically to one signal line, by writing an analog signal into this one signal line and by reading an output signal from the other output signal connected electrically to the inspection pad, a short circuit between the paired signal lines can be detected.

Thereby, the same advantages and effects as in the above-described third inspection method can be obtained.

Now, a fifth inspection method of inspecting a short circuit in the signal lines X (1, 2, 3 . . . ) of the array substrate 100 in the above-described display device will be described. In this fifth inspecting method, an inspection pad is mounted on each signal line, a short circuit between the signal lines adjacent to each other is inspected, and concurrently therewith the operations of the switches in the selection circuit are inspected.

Figure 16:
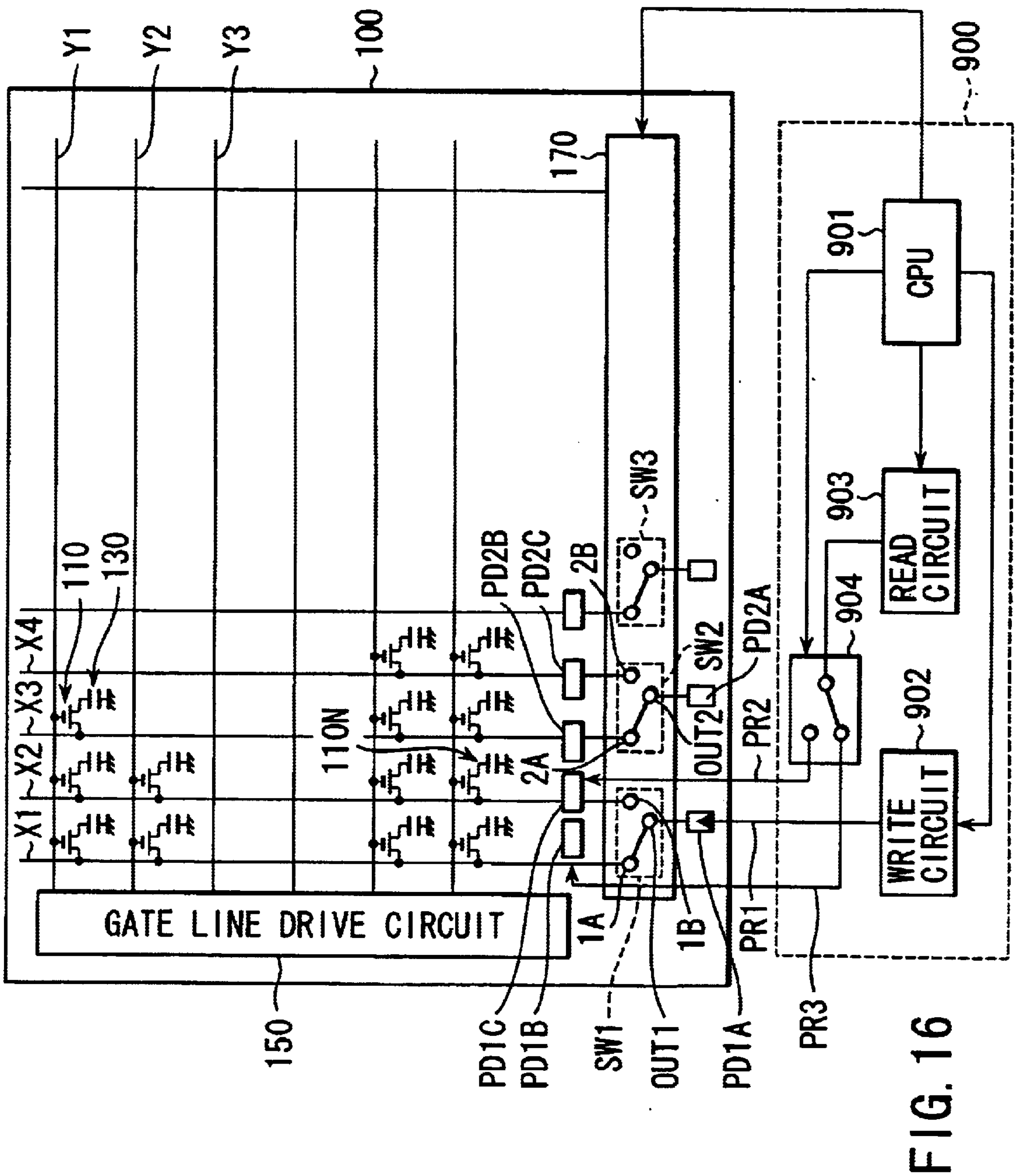
FIG. 16 is a view showing schematically the circuit composition for inspecting a short circuit between two signal lines in a fifth inspection method according to the present invention.

First, as shown in FIG. 16, an inspection circuit 900 is connected to the array substrate 100. This inspection circuit 900 comprises a CPU 901 controlling inner circuits and switches, a write circuit 902 writing analog signals into the signal lines, a read circuit 903 reading signals outputted from the signal lines, probes PRs (1, 2, 3) connected to the connection pads PDs (1, 2, 3 . . . ) respectively, and a distribute circuit 904 changing over from the second probe PR2 to the third probe PR3 or vice versa.

CPU 901 of the inspection circuit 900 outputs control signals onto the write circuit 902, the read circuit 903, the distribute circuit 904, and the selection circuit 170 of the array substrate 100 respectively in a predetermined timing.

On the other hand, on the array substrate 100 side, each switch SW (1, 2, . . . ) of the selection circuit 170 is formed so as to be capable of selecting input terminals 1A and 1B corresponding to two signal lines X1 and X2 for one output terminal OUT1. Moreover, the array substrate 100 comprises, on the signal line, an inspection pads PD1B, PD1C (PD2B, PD2C, . . . ) disposed between the switch SW (1, 2, . . . ) and the pixel transistor 110N nearest to this switch.

First, a method of inspecting a short circuit between a first signal line X1 and a second signal line X2 adjacent to each other and the operation of the selectable switch SW1 will be described. The first signal line X1 and the second signal line X2 are selected by means of the same switch SW1 of the selection circuit 170, and analog signals are written and read via the same connection pads PD1A.

That is, as shown in FIG. 16, the first probe PR1 is connected to the connection pad PD1A, and the second probe PR2 is connected to the inspection pad PD1C. And the third probe PR3 is connected to the connection pad PD1B.

And CPU 901 of the inspection circuit 900 outputs a control signal for connecting the output terminal OUT1 of the switch SW1 to the input terminal 1A of the first signal line X1 onto the selection circuit 170. Moreover, CPU 901 outputs a control signal for selecting the third probe PR3 onto the distribute circuit 904.

And CPU 901 controls the write circuit 902 and write a predetermined analog signal from the connection pad PD1A connected to the first signal line X1 via the first probe PR1.

Subsequently, CPU 901 controls the read circuit 903 and reads output signals from inspection pad PD1B on the signal line X1 via the third probe PR3.

When the predetermined analog signal has been detected from the inspection pad PB1B, CPU 901 judges that the switch SW1 in the selection circuit 170 operates normally, and when the predetermined analog signal has not been detected from the inspection pad PD1B, CPU 901 judges that the switch SW1 operates abnormally.

Now, a method of inspecting a short circuit between a first signal line X1 and a second signal line X2 adjacent to each other will be described.

That is, CPU 901 of the inspection circuit 900 outputs a control signal for connecting the output terminal OUT1 of the switch SW1 to the input terminal 1A of the first signal line X1 onto the selection circuit 170. Moreover, CPU 901 outputs a control signal for selecting the second probe PR2 onto the distribute circuit 904.

And CPU 901 controls the write circuit 902 and write a predetermined analog signal into the first signal line X1 via the first probe PR1.

Subsequently, CPU 901 controls the read circuit 903 and reads output signals from the signal line X2 via the second probe PR2.

When the predetermined analog signal has been detected from the second signal line X2, CPU 901 judges that there is a short circuit between the first signal line X1 and the second signal line X2, and when the predetermined analog signal has not been detected from the second signal line X2, CPU 901 judges that there is no short circuit between the first signal line X1 and the second signal line X2.

Now, a method of inspecting a short circuit between a second signal line X2 and a third signal line X3 adjacent to each other will be described. The second signal line X2 and the third signal line X3 are selected by means of the different switches of the selection circuit 170, that is, by means of the switches SW1 and SW2, and analog signals are written and read via the connection pads PD1A and PD2A connected to the switches SW1 and SW2 respectively.

At this time, the first probe PR1 is connected to the connection pad PD2A.

That is, CPU 901 outputs a control signal for connecting the output terminal OUT2 of the switch SW2 to the input terminal 2A of the third signal line X3 onto the selection circuit 170. Moreover, CPU 901 outputs a control signal for selecting the second probe PR2 onto the distribute circuit 904.

And CPU 901 controls the write circuit 902 and write a predetermined analog signal into the third signal line X3 via the first probe PR1.

Subsequently, CPU 901 controls the read circuit 903 and reads output signals from the second signal line X2 via the second probe PR2.

When the predetermined analog signal has been detected from the second signal line X2, CPU 901 judges that there is a short circuit between the second signal line X2 and the third signal line X3, and when the predetermined analog signal has not been detected from the second signal line X2, CPU 901 judges that there is no short circuit between the second signal line X2 and the third signal line X3.

Now, similarly, with two adjacent signal lines being paired, one probe of the inspection circuit being connected to a connection pad, the other pad being connected to an inspection pad mounted on the signal line, and with the connection pad connected to one probe being connected electrically to one signal line, by writing an analog signal into this one signal line and by reading an output signal from the other output signal connected electrically to the inspection pad, a short circuit between the paired signal lines can be detected.

And, similarly, by operating the switch in the selection circuit and by writing and reading signals between the connection pad and the inspection pad sandwiching this switch, the operation of the switch can be inspected without preparing new pads.

As described above, according to the present invention, there can be provided an array substrate of a display device being capable of realizing highly fine pixels. Moreover, according to the present invention, there can be provided a method of inspecting an array substrate for detecting a short circuit and breaking of a wire certainly without an increase in cost by using an easy maintenance inspection circuit.

Further, in the above-described embodiment, the present invention is applied to an array substrate of the liquid crystal display device, however, the present invention can be applied also to a method of inspecting an array substrate driven in a signal line distribute mode, for example, an array substrate composing an organic electroluminescence display device.

Figure 18:
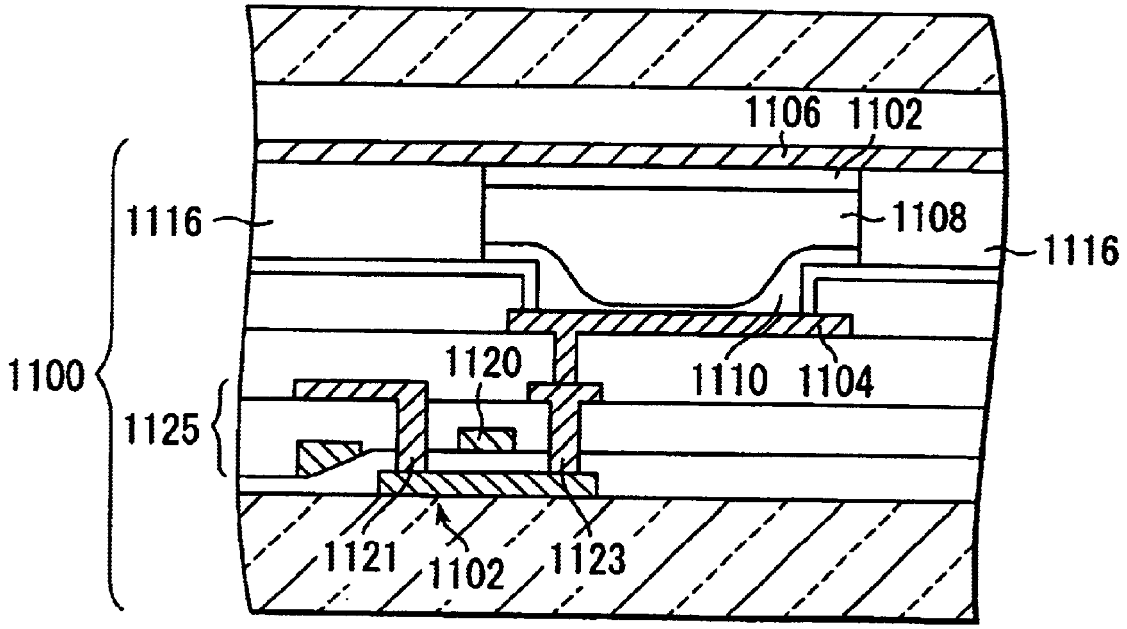
FIG. 18 is a sectional view showing schematically the composition of an organic EL display device (organic electroluminescence display device) according to one embodiment of the present invention.
Figure 19:
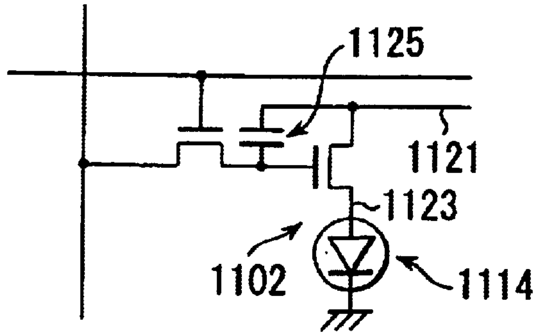
FIG. 19 is a plan view showing schematically the composition of an organic EL display device according to one embodiment of the present invention.

As shown in FIGS. 18 and 19, the organic electroluminescence display device comprises an array substrate 1100. This array substrate 1100 comprises a TFT 1102 disposed on a glass substrate, an anode 1104 connected to the TFT 1102, and a cathode 1106 opposed to the anode via an organic luminescent layer 1108. The surface of the anode 1104 is covered with an anode buffer layer 1110. And the surface of the cathode 1106 is covered with a cathode buffer layer 1112. A luminescent portion (display pixel) 1114 is defined by means of a partition 1116. This luminescent portion 1114 is composed of an anode 1104, a cathode 1106, and an organic luminescent layer 1108 disposed therebetween. The TFT 1102 comprises a gate electrode 1120. This TFT 1102 is connected to a current supply line 1121. A electrode portion 1123 of the TFT 1102 is connected to the anode 1104. The array substrate 1100 comprises a pixel capacitance 1125 connected in parallel to the TFT 1102.

When applying the inspection method according to this embodiment to the array substrate of the organic electroluminescence display device having the above-described composition, inspections are carried out preferably before the array substrate is completed, for example, before the organic luminescent layer is formed. By carrying out the inspections in this timing, array substrates having breaking of wire or short circuit defect in the current supply line or the like can be removed before they are fed to the next process, and useless work can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of inspecting an array substrate comprising a plurality of gate and signal lines disposed on the substrate and intersecting perpendicularly with each other, a switching element disposed on each intersecting portion of the gate lines and the signal lines, a pixel capacitance electrically connected to each switching element, a plurality of connection pads into which signals are inputted, and a selection circuit having at least a switch that distributes signals inputted from each of said connection pads to at least one signal line of a signal line group including a plurality of signal lines sequentially, the method of inspecting an array substrate comprising the steps of:

writing signals into a first signal line in a first signal line selection period in which said switch selects said first signal line from the signal line group;

reading signals from a second signal line in a second signal line selection period following said first signal line selection period in which said switch selects said second signal line from said signal line group; and inspecting a short circuit between said first signal line and said second signal line based upon the read signals.

2. The method of inspecting an array substrate according to claim 1, wherein said first signal line and said second signal line are selected by a first switch that is part of the selection circuit, and signals are written and read via a first connection pad connected to the first switch.

3. The method of inspecting an array substrate according to claim 1, wherein said first signal line and said second signal line are selected by the first switch and the second switch respectively, which are both part of the selection circuit and signals are written and read via a first connection pad and a second connection pad connected respectively to the first switch and the second switch.

4. The method of inspecting an array substrate according to claim 1, wherein said signals input into said plurality of connecting pads are inputted from an external drive circuit that converts inputted digital signals into analog signals, and divides said signal lines into a plurality of signal line groups composed of a predetermined number of signal lines and outputs analog signals corresponding to each of said signal line groups serially, and wherein said selection circuit distributes serial analog signals from said drive circuit to a corresponding signal line of each of said signal line group sequentially.

5. The method of inspecting an array substrate according to claim 4, wherein said drive circuit is mounted on a flexible wiring substrate and is connected electrically to said array substrate.

6. The method of inspecting an array substrate according to claim 1, wherein said array substrate includes integrally a gate line drive means supplying drive signals to said gate line.

* * * * *